US 011556416B2

(12) United States Patent
Tishbi et al.

(10) Patent No.: US 11,556,416 B2
(45) Date of Patent: Jan. 17, 2023

(54) CONTROLLING MEMORY READOUT RELIABILITY AND THROUGHPUT BY ADJUSTING DISTANCE BETWEEN READ THRESHOLDS

(71) Applicant: Apple Inc., Cupertino, CA (US)

(72) Inventors: Nir Tishbi, Kfar Saba (IL); Itay Sagron, Gedera (IL)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 17/558,622

(22) Filed: Dec. 22, 2021

(65) Prior Publication Data

US 2022/0374308 A1 Nov. 24, 2022

Related U.S. Application Data

(60) Provisional application No. 63/184,230, filed on May 5, 2021.

(51) Int. Cl.
*H03M 13/00* (2006.01)
*G06F 11/10* (2006.01)
(Continued)

(52) U.S. Cl.
CPC ........ *G06F 11/1068* (2013.01); *G06F 11/076* (2013.01); *H03M 13/1108* (2013.01); *H03M 13/1111* (2013.01); *H03M 13/6312* (2013.01)

(58) Field of Classification Search
CPC .............. G06F 11/1068; G06F 11/076; H03M 13/1108; H03M 13/1111; H03M 13/6312
See application file for complete search history.

(56) References Cited

U.S. PATENT DOCUMENTS 3,668,631 A 6/1972 Griffith et al.
3,668,632 A 6/1972 Oldham
(Continued)

FOREIGN PATENT DOCUMENTS

EP 0783754 B1 7/1997
EP 1434236 B1 6/2004
(Continued)

OTHER PUBLICATIONS

US 7,161,836 B1, 01/2007, Wan et al. (withdrawn)
(Continued)

*Primary Examiner* — Esaw T Abraham
(74) *Attorney, Agent, or Firm* — Kligler & Associates Patent Attorneys Ltd

(57) ABSTRACT

An apparatus for data storage includes an interface and a processor. The interface is configured to communicate with a memory device that includes (i) a plurality of memory cells and (ii) a data compression module. The processor is configured to determine a maximal number of errors that are required to be corrected by applying a soft decoding scheme to data retrieved from the memory cells, and based on the maximal number of errors, to determine an interval between multiple read thresholds for reading Code Words (CWs) stored in the memory cells for processing by the soft decoding scheme, so as to meet following conditions: (i) the soft decoding scheme achieves a specified decoding capability requirement, and (ii) a compression rate of the compression module when applied to confidence levels corresponding to readouts of the CWs, achieves a specified readout throughput requirement.

28 Claims, 5 Drawing Sheets

(51) Int. Cl.
*G06F 11/07* (2006.01)
*H03M 13/11* (2006.01)

(56) References Cited

U.S. PATENT DOCUMENTS

| | | |
|---|---|---|
| 4,058,851 A | 11/1977 | Scheuneman |
| 4,112,502 A | 9/1978 | Scheuneman |
| 4,394,763 A | 7/1983 | Nagano et al. |
| 4,413,339 A | 11/1983 | Riggle et al. |
| 4,556,961 A | 12/1985 | Iwahashi et al. |
| 4,558,431 A | 12/1985 | Satoh |
| 4,608,687 A | 8/1986 | Dutton |
| 4,654,847 A | 3/1987 | Dutton |
| 4,661,929 A | 4/1987 | Aoki et al. |
| 4,768,171 A | 8/1988 | Tada |
| 4,811,285 A | 3/1989 | Walker et al. |
| 4,899,342 A | 2/1990 | Potter et al. |
| 4,910,706 A | 3/1990 | Hyatt |
| 4,993,029 A | 2/1991 | Galbraith et al. |
| 5,056,089 A | 10/1991 | Furuta et al. |
| 5,077,722 A | 12/1991 | Geist et al. |
| 5,126,808 A | 6/1992 | Montalvo et al. |
| 5,163,021 A | 11/1992 | Mehrotra et al. |
| 5,172,338 A | 12/1992 | Mehrotta et al. |
| 5,182,558 A | 1/1993 | Mayo |
| 5,182,752 A | 1/1993 | Deroo et al. |
| 5,191,584 A | 3/1993 | Anderson |
| 5,200,959 A | 4/1993 | Gross et al. |
| 5,237,535 A | 8/1993 | Mielke et al. |
| 5,272,669 A | 12/1993 | Samachisa et al. |
| 5,276,649 A | 1/1994 | Hoshita et al. |
| 5,287,469 A | 2/1994 | Tsuboi |
| 5,365,484 A | 11/1994 | Cleveland et al. |
| 5,388,064 A | 2/1995 | Khan |
| 5,416,646 A | 5/1995 | Shirai |
| 5,416,782 A | 5/1995 | Wells et al. |
| 5,446,854 A | 8/1995 | Khalidi et al. |
| 5,450,424 A | 9/1995 | Okugaki et al. |
| 5,469,444 A | 11/1995 | Endoh et al. |
| 5,473,753 A | 12/1995 | Wells et al. |
| 5,479,170 A | 12/1995 | Cauwenberghs et al. |
| 5,495,486 A | 2/1996 | Gheewala |
| 5,508,958 A | 4/1996 | Fazio et al. |
| 5,519,831 A | 5/1996 | Holzhammer |
| 5,532,962 A | 7/1996 | Auclair et al. |
| 5,533,190 A | 7/1996 | Binford et al. |
| 5,541,886 A | 7/1996 | Hasbun |
| 5,600,677 A | 2/1997 | Citta et al. |
| 5,638,320 A | 6/1997 | Wong et al. |
| 5,657,332 A | 8/1997 | Auclair et al. |
| 5,675,540 A | 10/1997 | Roohparvar |
| 5,682,352 A | 10/1997 | Wong et al. |
| 5,687,114 A | 11/1997 | Khan |
| 5,696,717 A | 12/1997 | Koh |
| 5,726,649 A | 3/1998 | Tamaru et al. |
| 5,726,934 A | 3/1998 | Tran et al. |
| 5,742,752 A | 4/1998 | De Koning |
| 5,748,533 A | 5/1998 | Dunlap et al. |
| 5,748,534 A | 5/1998 | Dunlap et al. |
| 5,751,637 A | 5/1998 | Chen et al. |
| 5,761,402 A | 6/1998 | Kaneda et al. |
| 5,798,966 A | 8/1998 | Keeney |
| 5,799,200 A | 8/1998 | Brant et al. |
| 5,801,985 A | 9/1998 | Roohparvar et al. |
| 5,838,832 A | 11/1998 | Barnsley |
| 5,860,106 A | 1/1999 | Domen et al. |
| 5,867,114 A | 2/1999 | Barbir |
| 5,867,428 A | 2/1999 | Ishii et al. |
| 5,867,429 A | 2/1999 | Chen et al. |
| 5,877,986 A | 3/1999 | Harari et al. |
| 5,889,937 A | 3/1999 | Tamagawa |
| 5,901,089 A | 5/1999 | Korsh et al. |
| 5,909,449 A | 6/1999 | So et al. |
| 5,912,906 A | 6/1999 | Wu et al. |
| 5,930,167 A | 7/1999 | Lee et al. |
| 5,937,424 A | 8/1999 | Leak et al. |
| 5,942,004 A | 8/1999 | Cappelletti |
| 5,946,716 A | 8/1999 | Karp et al. |
| 5,969,986 A | 10/1999 | Wong et al. |
| 5,982,668 A | 11/1999 | Ishii et al. |
| 5,991,517 A | 11/1999 | Harari et al. |
| 5,995,417 A | 11/1999 | Chen et al. |
| 6,009,014 A | 12/1999 | Hollmer et al. |
| 6,009,016 A | 12/1999 | Ishii et al. |
| 6,023,425 A | 2/2000 | Ishii et al. |
| 6,034,891 A | 3/2000 | Norman |
| 6,040,993 A | 3/2000 | Chen et al. |
| 6,041,430 A | 3/2000 | Yamauchi |
| 6,073,204 A | 6/2000 | Lakhani et al. |
| 6,101,614 A | 8/2000 | Gonzales et al. |
| 6,128,237 A | 10/2000 | Shirley et al. |
| 6,134,140 A | 10/2000 | Tanaka et al. |
| 6,134,143 A | 10/2000 | Norman |
| 6,134,631 A | 10/2000 | Jennings |
| 6,141,261 A | 10/2000 | Patti |
| 6,151,246 A | 11/2000 | So et al. |
| 6,157,573 A | 12/2000 | Ishii et al. |
| 6,166,962 A | 12/2000 | Chen et al. |
| 6,169,691 B1 | 1/2001 | Pasotti et al. |
| 6,178,466 B1 | 1/2001 | Gilbertson et al. |
| 6,185,134 B1 | 2/2001 | Tanaka et al. |
| 6,209,113 B1 | 3/2001 | Roohparvar |
| 6,212,654 B1 | 4/2001 | Lou et al. |
| 6,219,276 B1 | 4/2001 | Parker |
| 6,219,447 B1 | 4/2001 | Lee et al. |
| 6,222,762 B1 | 4/2001 | Guterman et al. |
| 6,230,233 B1 | 5/2001 | Lofgren et al. |
| 6,240,458 B1 | 5/2001 | Gilbertson |
| 6,259,627 B1 | 7/2001 | Wong |
| 6,275,419 B1 | 8/2001 | Guterman et al. |
| 6,278,632 B1 | 8/2001 | Chevallier |
| 6,279,069 B1 | 8/2001 | Robinson et al. |
| 6,288,944 B1 | 9/2001 | Kawamura |
| 6,292,394 B1 | 9/2001 | Cohen et al. |
| 6,301,151 B1 | 10/2001 | Engh et al. |
| 6,304,486 B1 | 10/2001 | Yano |
| 6,307,776 B1 | 10/2001 | So et al. |
| 6,314,044 B1 | 11/2001 | Sasaki et al. |
| 6,317,363 B1 | 11/2001 | Guterman et al. |
| 6,317,364 B1 | 11/2001 | Guterman et al. |
| 6,345,004 B1 | 2/2002 | Omura et al. |
| 6,360,346 B1 | 3/2002 | Miyauchi et al. |
| 6,363,008 B1 | 3/2002 | Wong |
| 6,363,454 B1 | 3/2002 | Lakhani et al. |
| 6,366,496 B1 | 4/2002 | Torelli et al. |
| 6,385,092 B1 | 5/2002 | Ishii et al. |
| 6,392,932 B1 | 5/2002 | Ishii et al. |
| 6,396,742 B1 | 5/2002 | Korsh et al. |
| 6,397,364 B1 | 5/2002 | Barkan |
| 6,405,323 B1 | 6/2002 | Lin et al. |
| 6,405,342 B1 | 6/2002 | Lee |
| 6,418,060 B1 | 7/2002 | Yong et al. |
| 6,442,585 B1 | 8/2002 | Dean et al. |
| 6,445,602 B1 | 9/2002 | Kokudo et al. |
| 6,452,838 B1 | 9/2002 | Ishii et al. |
| 6,456,528 B1 | 9/2002 | Chen |
| 6,466,476 B1 | 10/2002 | Wong et al. |
| 6,467,062 B1 | 10/2002 | Barkan |
| 6,469,931 B1 | 10/2002 | Ban et al. |
| 6,480,948 B1 | 11/2002 | Virajpet et al. |
| 6,490,236 B1 | 12/2002 | Fukuda et al. |
| 6,522,580 B2 | 2/2003 | Chen et al. |
| 6,525,952 B2 | 2/2003 | Araki et al. |
| 6,532,556 B1 | 3/2003 | Wong et al. |
| 6,538,922 B1 | 3/2003 | Khalid et al. |
| 6,549,464 B2 | 4/2003 | Tanaka et al. |
| 6,553,510 B1 | 4/2003 | Pekny et al. |
| 6,558,967 B1 | 5/2003 | Wong |
| 6,560,152 B1 | 5/2003 | Cernea |
| 6,567,311 B2 | 5/2003 | Ishii et al. |
| 6,577,539 B2 | 6/2003 | Iwahashi |
| 6,584,012 B2 | 6/2003 | Banks |
| 6,615,307 B1 | 9/2003 | Roohparvar |
| 6,621,739 B2 | 9/2003 | Gonzales et al. |

(56) References Cited

U.S. PATENT DOCUMENTS

| | | |
|---|---|---|
| 6,640,326 B1 | 10/2003 | Buckingham et al. |
| 6,643,169 B2 | 11/2003 | Rudelic et al. |
| 6,646,913 B2 | 11/2003 | Micheloni et al. |
| 6,678,192 B2 | 1/2004 | Gongwer et al. |
| 6,683,811 B2 | 1/2004 | Ishii et al. |
| 6,687,155 B2 | 2/2004 | Nagasue |
| 6,707,748 B2 | 3/2004 | Lin et al. |
| 6,708,257 B2 | 3/2004 | Bao |
| 6,714,449 B2 | 3/2004 | Khalid |
| 6,717,847 B2 | 4/2004 | Chen |
| 6,731,557 B2 | 5/2004 | Beretta |
| 6,732,250 B2 | 5/2004 | Durrant |
| 6,738,293 B1 | 5/2004 | Iwahashi |
| 6,751,766 B2 | 6/2004 | Guterman et al. |
| 6,757,193 B2 | 6/2004 | Chen et al. |
| 6,774,808 B1 | 8/2004 | Hibbs et al. |
| 6,781,877 B2 | 8/2004 | Cernea et al. |
| 6,804,805 B2 | 10/2004 | Rub |
| 6,807,095 B2 | 10/2004 | Chen et al. |
| 6,807,101 B2 | 10/2004 | Ooishi et al. |
| 6,809,964 B2 | 10/2004 | Moschopoulos et al. |
| 6,819,592 B2 | 11/2004 | Noguchi et al. |
| 6,829,167 B2 | 12/2004 | Tu et al. |
| 6,845,052 B1 | 1/2005 | Ho et al. |
| 6,851,018 B2 | 2/2005 | Wyatt et al. |
| 6,851,081 B2 | 2/2005 | Yamamoto |
| 6,856,546 B2 | 2/2005 | Guterman et al. |
| 6,862,218 B2 | 3/2005 | Guterman et al. |
| 6,870,767 B2 | 3/2005 | Rudelic et al. |
| 6,870,773 B2 | 3/2005 | Noguchi et al. |
| 6,873,552 B2 | 3/2005 | Ishii et al. |
| 6,879,520 B2 | 4/2005 | Hosono et al. |
| 6,882,567 B1 | 4/2005 | Wong |
| 6,894,926 B2 | 5/2005 | Guterman et al. |
| 6,907,497 B2 | 6/2005 | Hosono et al. |
| 6,925,009 B2 | 8/2005 | Noguchi et al. |
| 6,930,925 B2 | 8/2005 | Guo et al. |
| 6,934,188 B2 | 8/2005 | Roohparvar |
| 6,937,511 B2 | 8/2005 | Hsu et al. |
| 6,958,938 B2 | 10/2005 | Noguchi et al. |
| 6,963,505 B2 | 11/2005 | Cohen |
| 6,972,993 B2 | 12/2005 | Conley et al. |
| 6,988,175 B2 | 1/2006 | Lasser |
| 6,992,932 B2 | 1/2006 | Cohen |
| 6,999,344 B2 | 2/2006 | Hosono et al. |
| 7,002,843 B2 | 2/2006 | Guterman et al. |
| 7,006,379 B2 | 2/2006 | Noguchi et al. |
| 7,012,835 B2 | 3/2006 | Gonzales et al. |
| 7,020,017 B2 | 3/2006 | Chen et al. |
| 7,023,735 B2 | 4/2006 | Ban et al. |
| 7,031,210 B2 | 4/2006 | Park et al. |
| 7,031,214 B2 | 4/2006 | Tran |
| 7,031,216 B2 | 4/2006 | You |
| 7,039,846 B2 | 5/2006 | Hewitt et al. |
| 7,042,766 B1 | 5/2006 | Wang et al. |
| 7,054,193 B1 | 5/2006 | Wong |
| 7,054,199 B2 | 5/2006 | Lee et al. |
| 7,057,958 B2 | 6/2006 | So et al. |
| 7,065,147 B2 | 6/2006 | Ophir et al. |
| 7,068,539 B2 | 6/2006 | Guterman et al. |
| 7,071,849 B2 | 7/2006 | Zhang |
| 7,072,222 B2 | 7/2006 | Ishii et al. |
| 7,079,555 B2 | 7/2006 | Baydar et al. |
| 7,088,615 B2 | 8/2006 | Guterman et al. |
| 7,096,406 B2 | 8/2006 | Kanazawa et al. |
| 7,099,194 B2 | 8/2006 | Tu et al. |
| 7,102,924 B2 | 9/2006 | Chen et al. |
| 7,113,432 B2 | 9/2006 | Mokhlesi |
| 7,130,210 B2 | 10/2006 | Bathul et al. |
| 7,139,192 B1 | 11/2006 | Wong |
| 7,139,198 B2 | 11/2006 | Guterman et al. |
| 7,145,805 B2 | 12/2006 | Ishii et al. |
| 7,151,692 B2 | 12/2006 | Wu |
| 7,158,058 B1 | 1/2007 | Yu |
| 7,170,781 B2 | 1/2007 | So et al. |
| 7,170,802 B2 | 1/2007 | Cernea et al. |
| 7,173,859 B2 | 2/2007 | Hemink |
| 7,177,184 B2 | 2/2007 | Chen |
| 7,177,195 B2 | 2/2007 | Gonzales et al. |
| 7,177,199 B2 | 2/2007 | Chen et al. |
| 7,177,200 B2 | 2/2007 | Ronen et al. |
| 7,184,338 B2 | 2/2007 | Nagakawa et al. |
| 7,187,195 B2 | 3/2007 | Kim |
| 7,187,592 B2 | 3/2007 | Guterman et al. |
| 7,190,614 B2 | 3/2007 | Wu |
| 7,193,898 B2 | 3/2007 | Cernea |
| 7,193,921 B2 | 3/2007 | Choi et al. |
| 7,196,644 B1 | 3/2007 | Anderson et al. |
| 7,196,928 B2 | 3/2007 | Chen |
| 7,196,933 B2 | 3/2007 | Shibata |
| 7,197,594 B2 | 3/2007 | Raz et al. |
| 7,200,062 B2 | 4/2007 | Kinsely et al. |
| 7,210,077 B2 | 4/2007 | Brandenberger et al. |
| 7,221,592 B2 | 5/2007 | Nazarian |
| 7,224,613 B2 | 5/2007 | Chen et al. |
| 7,231,474 B1 | 6/2007 | Helms et al. |
| 7,231,562 B2 | 6/2007 | Ohlhoff et al. |
| 7,243,275 B2 | 7/2007 | Gongwer et al. |
| 7,254,690 B2 | 8/2007 | Rao |
| 7,254,763 B2 | 8/2007 | Aadsen et al. |
| 7,257,027 B2 | 8/2007 | Park |
| 7,259,987 B2 | 8/2007 | Chen et al. |
| 7,266,026 B2 | 9/2007 | Gongwer et al. |
| 7,266,069 B2 | 9/2007 | Chu |
| 7,269,066 B2 | 9/2007 | Nguyen et al. |
| 7,272,757 B2 | 9/2007 | Stocken |
| 7,274,611 B2 | 9/2007 | Roohparvar |
| 7,277,355 B2 | 10/2007 | Tanzana |
| 7,280,398 B1 | 10/2007 | Lee et al. |
| 7,280,409 B2 | 10/2007 | Misumi et al. |
| 7,280,415 B2 | 10/2007 | Hwang et al. |
| 7,283,399 B2 | 10/2007 | Ishii et al. |
| 7,289,344 B2 | 10/2007 | Chen |
| 7,301,807 B2 | 11/2007 | Khalid et al. |
| 7,301,817 B2 | 11/2007 | Li et al. |
| 7,308,525 B2 | 12/2007 | Lasser et al. |
| 7,310,255 B2 | 12/2007 | Chan |
| 7,310,269 B2 | 12/2007 | Shibata |
| 7,310,271 B2 | 12/2007 | Lee |
| 7,310,272 B1 | 12/2007 | Mokhesi et al. |
| 7,310,347 B2 | 12/2007 | Lasser |
| 7,312,727 B1 | 12/2007 | Feng et al. |
| 7,321,509 B2 | 1/2008 | Chen et al. |
| 7,328,384 B1 | 2/2008 | Kulkarni et al. |
| 7,342,831 B2 | 3/2008 | Mokhlesi et al. |
| 7,343,330 B1 | 3/2008 | Boesjes et al. |
| 7,345,924 B2 | 3/2008 | Nguyen et al. |
| 7,345,928 B2 | 3/2008 | Li |
| 7,349,263 B2 | 3/2008 | Kim et al. |
| 7,356,755 B2 | 4/2008 | Fackenthal |
| 7,363,420 B2 | 4/2008 | Lin et al. |
| 7,365,671 B1 | 4/2008 | Anderson |
| 7,369,434 B2 | 5/2008 | Radke |
| 7,388,781 B2 | 6/2008 | Litsyn et al. |
| 7,397,697 B2 | 7/2008 | So et al. |
| 7,405,974 B2 | 7/2008 | Yaoi et al. |
| 7,405,979 B2 | 7/2008 | Ishii et al. |
| 7,408,804 B2 | 8/2008 | Hemink et al. |
| 7,408,810 B2 | 8/2008 | Aritome et al. |
| 7,409,473 B2 | 8/2008 | Conley et al. |
| 7,409,623 B2 | 8/2008 | Baker et al. |
| 7,420,847 B2 | 9/2008 | Li |
| 7,433,231 B2 | 10/2008 | Aritome |
| 7,433,697 B2 | 10/2008 | Karaoguz et al. |
| 7,434,111 B2 | 10/2008 | Sugiura et al. |
| 7,437,498 B2 | 10/2008 | Ronen |
| 7,440,324 B2 | 10/2008 | Mokhlesi |
| 7,440,331 B2 | 10/2008 | Hemink |
| 7,441,067 B2 | 10/2008 | Gorobetz et al. |
| 7,447,970 B2 | 11/2008 | Wu et al. |
| 7,450,421 B2 | 11/2008 | Mokhlesi et al. |
| 7,453,737 B2 | 11/2008 | Ha |
| 7,457,163 B2 | 11/2008 | Hemink |
| 7,457,897 B1 | 11/2008 | Lee et al. |

(56) References Cited

U.S. PATENT DOCUMENTS

| | | |
|---|---|---|
| 7,460,410 B2 | 12/2008 | Nagai et al. |
| 7,460,412 B2 | 12/2008 | Lee et al. |
| 7,466,592 B2 | 12/2008 | Mitani et al. |
| 7,468,907 B2 | 12/2008 | Kang et al. |
| 7,468,911 B2 | 12/2008 | Lutze et al. |
| 7,469,049 B1 | 12/2008 | Feng |
| 7,471,581 B2 | 12/2008 | Tran et al. |
| 7,483,319 B2 | 1/2009 | Brown |
| 7,487,329 B2 | 2/2009 | Hepkin et al. |
| 7,487,394 B2 | 2/2009 | Forhan et al. |
| 7,492,641 B2 | 2/2009 | Hosono et al. |
| 7,508,710 B2 | 3/2009 | Mokhlesi |
| 7,526,711 B2 | 4/2009 | Orio |
| 7,539,061 B2 | 5/2009 | Lee |
| 7,539,062 B2 | 5/2009 | Doyle |
| 7,551,492 B2 | 6/2009 | Kim |
| 7,558,109 B2 | 7/2009 | Brandman et al. |
| 7,558,839 B1 | 7/2009 | McGovern |
| 7,568,135 B2 | 7/2009 | Cornwell et al. |
| 7,570,520 B2 | 8/2009 | Kamei et al. |
| 7,574,555 B2 | 8/2009 | Porat et al. |
| 7,590,002 B2 | 9/2009 | Mokhlesi et al. |
| 7,593,259 B2 | 9/2009 | Kim et al. |
| 7,594,093 B1 | 9/2009 | Kancherla |
| 7,596,707 B1 | 9/2009 | Vemula |
| 7,609,787 B2 | 10/2009 | Jahan et al. |
| 7,613,043 B2 | 11/2009 | Cornwell et al. |
| 7,616,498 B2 | 11/2009 | Mokhlesi et al. |
| 7,619,918 B2 | 11/2009 | Aritome |
| 7,631,245 B2 | 12/2009 | Lasser |
| 7,633,798 B2 | 12/2009 | Sarin et al. |
| 7,633,802 B2 | 12/2009 | Mokhlesi |
| 7,639,532 B2 | 12/2009 | Roohparvar et al. |
| 7,644,347 B2 | 1/2010 | Alexander et al. |
| 7,656,734 B2 | 2/2010 | Thorp et al. |
| 7,660,158 B2 | 2/2010 | Aritome |
| 7,660,183 B2 | 2/2010 | Ware et al. |
| 7,661,000 B2 | 2/2010 | Ueda et al. |
| 7,661,054 B2 | 2/2010 | Huffman et al. |
| 7,665,007 B2 | 2/2010 | Yang et al. |
| 7,680,987 B1 | 3/2010 | Clark et al. |
| 7,733,712 B1 | 6/2010 | Walston et al. |
| 7,742,351 B2 | 6/2010 | Inoue et al. |
| 7,761,624 B2 | 7/2010 | Karamcheti et al. |
| 7,797,609 B2 | 9/2010 | Neuman |
| 7,810,017 B2 | 10/2010 | Radke |
| 7,848,149 B2 | 12/2010 | Gonzales et al. |
| 7,869,273 B2 | 1/2011 | Lee et al. |
| 7,885,119 B2 | 2/2011 | Li |
| 7,904,783 B2 | 3/2011 | Brandman et al. |
| 7,925,936 B1 | 4/2011 | Sommer |
| 7,928,497 B2 | 4/2011 | Yaegashi |
| 7,929,549 B1 | 4/2011 | Talbot |
| 7,930,515 B2 | 4/2011 | Gupta et al. |
| 7,945,825 B2 | 5/2011 | Cohen et al. |
| 7,978,516 B2 | 7/2011 | Olbrich et al. |
| 7,995,388 B1 | 8/2011 | Winter et al. |
| 8,000,141 B1 | 8/2011 | Shalvi et al. |
| 3,014,094 A1 | 9/2011 | Jin |
| 3,040,744 A1 | 10/2011 | Gorobets et al. |
| 8,037,380 B2 | 10/2011 | Cagno et al. |
| 8,059,457 B2 | 11/2011 | Perlmutter et al. |
| 8,065,583 B2 | 11/2011 | Radke |
| 8,230,300 B2 | 7/2012 | Perlmutter et al. |
| 8,239,747 B2 | 8/2012 | Cho et al. |
| 8,374,014 B2 | 2/2013 | Rotbard et al. |
| 8,400,858 B2 | 3/2013 | Meir et al. |
| 8,429,493 B2 | 4/2013 | Sokolov et al. |
| 8,479,080 B1 | 7/2013 | Shalvi et al. |
| 8,493,781 B1 | 7/2013 | Meir et al. |
| 8,493,783 B2 | 7/2013 | Meir et al. |
| 8,495,465 B1 | 7/2013 | Anholt et al. |
| 8,570,804 B2 | 10/2013 | Shalvi et al. |
| 8,572,311 B1 | 10/2013 | Shalvi et al. |
| 8,572,423 B1 | 10/2013 | Isachar et al. |
| 8,599,611 B2 | 12/2013 | Shalvi et al. |
| 8,645,794 B1 | 2/2014 | Meir et al. |
| 8,677,054 B1 | 3/2014 | Meir et al. |
| 8,677,203 B1 | 3/2014 | Shalvi et al. |
| 8,694,814 B1 | 4/2014 | Salomon et al. |
| 8,694,853 B1 | 4/2014 | Sommer |
| 8,694,854 B1 | 4/2014 | Dar et al. |
| 8,767,459 B1 | 7/2014 | Kasorla et al. |
| 8,886,990 B2 | 11/2014 | Meir et al. |
| 8,990,665 B1 * | 3/2015 | Steiner .................. G11C 16/26 |
| | | 714/780 |
| 8,996,793 B1 * | 3/2015 | Steiner ............. H03M 13/3738 |
| | | 711/103 |
| 9,021,181 B1 | 4/2015 | Rotbard et al. |
| 9,032,263 B2 * | 5/2015 | Yang .................. H03M 13/451 |
| | | 714/719 |
| 9,104,580 B1 | 8/2015 | Meir |
| 9,214,965 B2 | 12/2015 | Fitzpatrick et al. |
| 9,229,861 B2 | 1/2016 | Perlmutter et al. |
| 9,454,414 B2 | 9/2016 | Micheloni et al. |
| 9,671,972 B2 | 6/2017 | Perlmutter et al. |
| 9,672,942 B2 * | 6/2017 | Yoon .................. G06F 11/1012 |
| 9,912,353 B1 | 3/2018 | Low |
| 9,985,651 B2 * | 5/2018 | Varanasi ................ G06F 11/073 |
| 10,157,013 B2 | 12/2018 | Perlmutter et al. |
| 10,474,525 B2 * | 11/2019 | Sharon .................. G11C 29/52 |
| 10,847,241 B2 * | 11/2020 | Yassine ................ G06F 17/11 |
| 10,872,013 B2 * | 12/2020 | Symons ............. H03M 13/1111 |
| 11,032,031 B2 | 6/2021 | Jiang et al. |
| 11,450,400 B2 * | 9/2022 | Yun .................. H03M 13/2948 |
| 2001/0002172 A1 | 5/2001 | Tanaka et al. |
| 2001/0006479 A1 | 7/2001 | Ikehashi et al. |
| 2002/0038440 A1 | 3/2002 | Barkan |
| 2002/0056064 A1 | 5/2002 | Kidorf et al. |
| 2002/0118574 A1 | 8/2002 | Gongwer et al. |
| 2002/0133684 A1 | 9/2002 | Anderson |
| 2002/0166091 A1 | 11/2002 | Kidorf et al. |
| 2002/0174295 A1 | 11/2002 | Ulrich et al. |
| 2002/0196510 A1 | 12/2002 | Hietala et al. |
| 2003/0002348 A1 | 1/2003 | Chen et al. |
| 2003/0103400 A1 | 6/2003 | Van Tran |
| 2003/0161183 A1 | 8/2003 | Tran |
| 2003/0189856 A1 | 10/2003 | Cho et al. |
| 2004/0057265 A1 | 3/2004 | Mirabel et al. |
| 2004/0057285 A1 | 3/2004 | Cernea et al. |
| 2004/0083333 A1 | 4/2004 | Chang et al. |
| 2004/0083334 A1 | 4/2004 | Chang et al. |
| 2004/0105311 A1 | 6/2004 | Cernea et al. |
| 2004/0114437 A1 | 6/2004 | Li |
| 2004/0160842 A1 | 8/2004 | Fukiage |
| 2004/0223371 A1 | 11/2004 | Roohparvar |
| 2005/0007802 A1 | 1/2005 | Gerpheide |
| 2005/0013165 A1 | 1/2005 | Ban |
| 2005/0024941 A1 | 2/2005 | Lasser et al. |
| 2005/0024978 A1 | 2/2005 | Ronen |
| 2005/0030788 A1 | 2/2005 | Parkinson et al. |
| 2005/0086574 A1 | 4/2005 | Fackenthal |
| 2005/0121436 A1 | 6/2005 | Kamitani et al. |
| 2005/0144361 A1 | 6/2005 | Gonzalez et al. |
| 2005/0157555 A1 | 7/2005 | Ono et al. |
| 2005/0162913 A1 | 7/2005 | Chen |
| 2005/0169051 A1 | 8/2005 | Khalid et al. |
| 2005/0189649 A1 | 9/2005 | Maruyama et al. |
| 2005/0213393 A1 | 9/2005 | Lasser |
| 2005/0224853 A1 | 10/2005 | Ohkawa |
| 2005/0240745 A1 | 10/2005 | Iyer et al. |
| 2005/0243626 A1 | 11/2005 | Ronen |
| 2006/0004952 A1 | 1/2006 | Lasser |
| 2006/0028875 A1 | 2/2006 | Avraham et al. |
| 2006/0028877 A1 | 2/2006 | Meir |
| 2006/0101193 A1 | 5/2006 | Murin |
| 2006/0106972 A1 | 5/2006 | Gorobets et al. |
| 2006/0107136 A1 | 5/2006 | Gongwer et al. |
| 2006/0129750 A1 | 6/2006 | Lee et al. |
| 2006/0133141 A1 | 6/2006 | Gorobets |
| 2006/0156189 A1 | 7/2006 | Tomlin |
| 2006/0179334 A1 | 8/2006 | Brittain et al. |
| 2006/0190699 A1 | 8/2006 | Lee |
| 2006/0203546 A1 | 9/2006 | Lasser |

(56) References Cited

U.S. PATENT DOCUMENTS

| | | |
|---|---|---|
| 2006/0218359 A1 | 9/2006 | Sanders et al. |
| 2006/0221692 A1 | 10/2006 | Chen |
| 2006/0221705 A1 | 10/2006 | Hemkin et al. |
| 2006/0221714 A1 | 10/2006 | Li et al. |
| 2006/0239077 A1 | 10/2006 | Park et al. |
| 2006/0239081 A1 | 10/2006 | Roohparvar |
| 2006/0256620 A1 | 11/2006 | Nguyen et al. |
| 2006/0256626 A1 | 11/2006 | Werner et al. |
| 2006/0256891 A1 | 11/2006 | Yuan et al. |
| 2006/0271748 A1 | 11/2006 | Jain et al. |
| 2006/0285392 A1 | 12/2006 | Incarnati et al. |
| 2006/0285396 A1 | 12/2006 | Ha |
| 2007/0006013 A1 | 1/2007 | Moshayedi et al. |
| 2007/0019481 A1 | 1/2007 | Park |
| 2007/0033581 A1 | 2/2007 | Tomlin et al. |
| 2007/0047314 A1 | 3/2007 | Goda et al. |
| 2007/0047326 A1 | 3/2007 | Nguyen et al. |
| 2007/0050536 A1 | 3/2007 | Kolokowsky |
| 2007/0058446 A1 | 3/2007 | Hwang et al. |
| 2007/0061502 A1 | 3/2007 | Lasser et al. |
| 2007/0067667 A1 | 3/2007 | Ikeuchi et al. |
| 2007/0074093 A1 | 3/2007 | Lasser |
| 2007/0086239 A1 | 4/2007 | Litsyn et al. |
| 2007/0086260 A1 | 4/2007 | Sinclair |
| 2007/0089034 A1 | 4/2007 | Litsyn et al. |
| 2007/0091677 A1 | 4/2007 | Lasser et al. |
| 2007/0091694 A1 | 4/2007 | Lee et al. |
| 2007/0103978 A1 | 5/2007 | Conley et al. |
| 2007/0103986 A1 | 5/2007 | Chen |
| 2007/0104211 A1 | 5/2007 | Opsasnick |
| 2007/0109845 A1 | 5/2007 | Chen |
| 2007/0109849 A1 | 5/2007 | Chen |
| 2007/0115726 A1 | 5/2007 | Cohen et al. |
| 2007/0118713 A1 | 5/2007 | Guterman et al. |
| 2007/0143378 A1 | 6/2007 | Gorobetz |
| 2007/0143531 A1 | 6/2007 | Atri |
| 2007/0159889 A1 | 7/2007 | Kang et al. |
| 2007/0159892 A1 | 7/2007 | Kang et al. |
| 2007/0159907 A1 | 7/2007 | Kwak |
| 2007/0168837 A1 | 7/2007 | Murin |
| 2007/0171714 A1 | 7/2007 | Wu et al. |
| 2007/0183210 A1 | 8/2007 | Choi et al. |
| 2007/0189073 A1 | 8/2007 | Aritome |
| 2007/0195602 A1 | 8/2007 | Fong et al. |
| 2007/0206426 A1 | 9/2007 | Mokhlesi |
| 2007/0208904 A1 | 9/2007 | Hsieh et al. |
| 2007/0226599 A1 | 9/2007 | Motwani |
| 2007/0236990 A1 | 10/2007 | Aritome |
| 2007/0253249 A1 | 11/2007 | Kang et al. |
| 2007/0256620 A1 | 11/2007 | Viggiano et al. |
| 2007/0263455 A1 | 11/2007 | Cornwell et al. |
| 2007/0266232 A1 | 11/2007 | Rodgers et al. |
| 2007/0271424 A1 | 11/2007 | Lee et al. |
| 2007/0280000 A1 | 12/2007 | Fujiu et al. |
| 2007/0291571 A1 | 12/2007 | Balasundaram |
| 2007/0297234 A1 | 12/2007 | Cernea et al. |
| 2008/0010395 A1 | 1/2008 | Mylly et al. |
| 2008/0025121 A1 | 1/2008 | Tanzawa |
| 2008/0043535 A1 | 2/2008 | Roohparvar |
| 2008/0049504 A1 | 2/2008 | Kasahara et al. |
| 2008/0049506 A1 | 2/2008 | Guterman |
| 2008/0052446 A1 | 2/2008 | Lasser et al. |
| 2008/0055993 A1 | 3/2008 | Lee |
| 2008/0080243 A1 | 4/2008 | Edahiro et al. |
| 2008/0082730 A1 | 4/2008 | Kim et al. |
| 2008/0086631 A1 | 4/2008 | Chow et al. |
| 2008/0089123 A1 | 4/2008 | Chae et al. |
| 2008/0104309 A1 | 5/2008 | Cheon et al. |
| 2008/0104312 A1 | 5/2008 | Lasser |
| 2008/0109590 A1 | 5/2008 | Jung et al. |
| 2008/0115017 A1 | 5/2008 | Jacobson |
| 2008/0123420 A1 | 5/2008 | Brandman et al. |
| 2008/0123426 A1 | 5/2008 | Lutze et al. |
| 2008/0126686 A1 | 5/2008 | Sokolov et al. |
| 2008/0130341 A1 | 6/2008 | Shalvi et al. |
| 2008/0148115 A1 | 6/2008 | Sokolov et al. |
| 2008/0151618 A1 | 6/2008 | Sharon et al. |
| 2008/0151667 A1 | 6/2008 | Miu et al. |
| 2008/0158958 A1 | 7/2008 | Sokolov et al. |
| 2008/0181001 A1 | 7/2008 | Shalvi |
| 2008/0198650 A1 | 8/2008 | Shalvi et al. |
| 2008/0198654 A1 | 8/2008 | Toda |
| 2008/0209116 A1 | 8/2008 | Caulkins |
| 2008/0209304 A1 | 8/2008 | Winarski et al. |
| 2008/0215798 A1 | 9/2008 | Sharon et al. |
| 2008/0219050 A1 | 9/2008 | Shalvi et al. |
| 2008/0239093 A1 | 10/2008 | Easwar et al. |
| 2008/0239812 A1 | 10/2008 | Abiko et al. |
| 2008/0253188 A1 | 10/2008 | Aritome |
| 2008/0263262 A1 | 10/2008 | Sokolov et al. |
| 2008/0263676 A1 | 10/2008 | Mo et al. |
| 2008/0270730 A1 | 10/2008 | Lasser et al. |
| 2008/0282106 A1 | 11/2008 | Shalvi et al. |
| 2008/0288714 A1 | 11/2008 | Salomon et al. |
| 2009/0013233 A1 | 1/2009 | Radke |
| 2009/0024905 A1 | 1/2009 | Shalvi et al. |
| 2009/0034337 A1 | 2/2009 | Aritome |
| 2009/0043831 A1 | 2/2009 | Antonopoulos et al. |
| 2009/0043951 A1 | 2/2009 | Shalvi et al. |
| 2009/0049234 A1 | 2/2009 | Oh et al. |
| 2009/0073762 A1 | 3/2009 | Lee et al. |
| 2009/0086542 A1 | 4/2009 | Lee et al. |
| 2009/0089484 A1 | 4/2009 | Chu |
| 2009/0091979 A1 | 4/2009 | Shalvi |
| 2009/0094930 A1 | 4/2009 | Schwoerer |
| 2009/0106485 A1 | 4/2009 | Anholt |
| 2009/0112949 A1 | 4/2009 | Ergan et al. |
| 2009/0132755 A1 | 5/2009 | Radke |
| 2009/0144600 A1 | 6/2009 | Perlmutter et al. |
| 2009/0150894 A1 | 6/2009 | Huang et al. |
| 2009/0157950 A1 | 6/2009 | Selinger |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0172257 A1 | 7/2009 | Prins et al. |
| 2009/0172261 A1 | 7/2009 | Prins et al. |
| 2009/0193184 A1 | 7/2009 | Yu et al. |
| 2009/0199074 A1 | 8/2009 | Sommer et al. |
| 2009/0204824 A1 | 8/2009 | Lin et al. |
| 2009/0204872 A1 | 8/2009 | Yu et al. |
| 2009/0213653 A1 | 8/2009 | Perlmutter et al. |
| 2009/0213654 A1 | 8/2009 | Perlmutter et al. |
| 2009/0225595 A1 | 9/2009 | Kim |
| 2009/0228761 A1 | 9/2009 | Perlmutter et al. |
| 2009/0265509 A1 | 10/2009 | Klein |
| 2009/0300227 A1 | 12/2009 | Nochimowski et al. |
| 2009/0323412 A1 | 12/2009 | Mokhlesi et al. |
| 2009/0327608 A1 | 12/2009 | Eschmann |
| 2010/0017650 A1 | 1/2010 | Chin et al. |
| 2010/0034022 A1 | 2/2010 | Dutta et al. |
| 2010/0057976 A1 | 3/2010 | Lasser |
| 2010/0061151 A1 | 3/2010 | Miwa et al. |
| 2010/0082883 A1 | 4/2010 | Chen et al. |
| 2010/0083247 A1 | 4/2010 | Kanevsky et al. |
| 2010/0110580 A1 | 5/2010 | Takashima |
| 2010/0131697 A1 | 5/2010 | Alrod et al. |
| 2010/0137167 A1 | 6/2010 | Hellsten et al. |
| 2010/0142268 A1 | 6/2010 | Aritome |
| 2010/0142277 A1 | 6/2010 | Yang et al. |
| 2010/0169547 A1 | 7/2010 | Ou |
| 2010/0169743 A1 | 7/2010 | Vogan et al. |
| 2010/0174847 A1 | 7/2010 | Paley et al. |
| 2010/0211803 A1 | 8/2010 | Lablans |
| 2010/0287217 A1 | 11/2010 | Borchers et al. |
| 2011/0010489 A1 | 1/2011 | Yeh |
| 2011/0060969 A1 | 3/2011 | Ramamoorthy et al. |
| 2011/0066793 A1 | 3/2011 | Burd |
| 2011/0075482 A1 | 3/2011 | Shepard et al. |
| 2011/0107049 A1 | 5/2011 | Kwon et al. |
| 2011/0149657 A1 | 6/2011 | Haratsch et al. |
| 2011/0199823 A1 | 8/2011 | Bar-Or et al. |
| 2011/0302354 A1 | 12/2011 | Miller |
| 2012/0297116 A1 | 11/2012 | Gurgi et al. |

(56) References Cited

U.S. PATENT DOCUMENTS

| | | |
|---|---|---|
| 2015/0149840 A1 | 5/2015 | Alhussien et al. |
| 2015/0205664 A1 | 7/2015 | Janik et al. |
| 2017/0185299 A1 | 6/2017 | Conley et al. |

FOREIGN PATENT DOCUMENTS

| | | |
|---|---|---|
| EP | 1605509 A1 | 12/2005 |
| WO | 199610256 A1 | 4/1996 |
| WO | 1998028745 A1 | 7/1998 |
| WO | 2002100112 A1 | 12/2002 |
| WO | 2003100791 A1 | 12/2003 |
| WO | 2007046084 A2 | 4/2007 |
| WO | 2007132452 A2 | 11/2007 |
| WO | 2007132453 A2 | 11/2007 |
| WO | 2007132456 A2 | 11/2007 |
| WO | 2007132457 A2 | 11/2007 |
| WO | 2007132458 A2 | 11/2007 |
| WO | 2007146010 A2 | 12/2007 |
| WO | 2008026203 A2 | 3/2008 |
| WO | 2008053472 A2 | 5/2008 |
| WO | 2008053473 A2 | 5/2008 |
| WO | 2008068747 A2 | 6/2008 |
| WO | 2008077284 A1 | 7/2008 |
| WO | 2008083131 A2 | 7/2008 |
| WO | 2008099958 A1 | 8/2008 |
| WO | 2008111058 A2 | 9/2008 |
| WO | 2008124760 A2 | 10/2008 |
| WO | 2008139441 A2 | 11/2008 |
| WO | 2009037691 A2 | 3/2009 |
| WO | 2009037697 A2 | 3/2009 |
| WO | 2009038961 A2 | 3/2009 |
| WO | 2009050703 A2 | 4/2009 |
| WO | 2009053961 A2 | 4/2009 |
| WO | 2009053962 A2 | 4/2009 |
| WO | 2009053963 A2 | 4/2009 |
| WO | 2009063450 A2 | 5/2009 |
| WO | 2009072100 A2 | 6/2009 |
| WO | 2009072101 A2 | 6/2009 |
| WO | 2009072102 A2 | 6/2009 |
| WO | 2009072103 A2 | 6/2009 |
| WO | 2009072104 A2 | 6/2009 |
| WO | 2009072105 A2 | 6/2009 |
| WO | 2009074978 A2 | 6/2009 |
| WO | 2009074979 A2 | 6/2009 |
| WO | 2009078006 A2 | 6/2009 |
| WO | 2009095902 A2 | 8/2009 |
| WO | 2011024015 A1 | 3/2011 |

OTHER PUBLICATIONS

Wei, "Trellis-Coded Modulation With Multidimensional Constellations", IEEE Transactions on Information Theory, vol. IT-33, No. 4, pp. 483-501, Jul. 1987.

Conway et al., "Sphere Packings, Lattices and Groups", Springer-Verlag, New York, Inc., USA, 3rd edition, chapter 4, pp. 94-135, year 1998.

Ankolekar et al., "Multibit Error-Correction Methods for Latency-Constrained Flash Memory Systems", IEEE Transactions on Device and Materials Reliability, vol. 10, No. 1, pp. 33-39, Mar. 2010.

Berman et al., "Mitigating Inter-Cell Coupling Effects in MLC NAND Flash via Constrained Coding", Presentation, Flash Memory Summit, Santa Clara, USA, pp. 1-21, Aug. 19, 2010.

Kim et al., "Multi-bit Error Tolerant Caches Using Two-Dimensional Error Coding", Proceedings of the 40th Annual ACM/IEEE International Symposium on Microarchitecture (MICRO-40), Chicago, USA, pp. 197-209, Dec. 2007.

Budilovsky et al., "Prototyping a High-Performance Low-Cost Solid-State Disk", SYSTOR—The 4th Annual International Systems and Storage Conference, Haifa, Israel, pp. 1-11, year 2011.

NVM Express Protocol, "NVM Express", Revision 1.2a, pp. 1-209, Oct. 23, 2015.

SCSI Protocol, "Information Technology—SCSI Architecture Model—5 (SAM-5)", INCITS project T10/2104-D, revision 01, pp. 1-150, Jan. 28, 2009.

SAS Protocol, "Information Technology—Serial Attached SCSI—2 (SAS-2)", INCITS project T10/1760-D, revision 15a, pp. 1-921, Feb. 22, 2009.

Agrell et al., "Closest Point Search in Lattices," IEEE Transactions on Information Theory, vol. 48, No. 8, pp. 2201-2214, Aug. 2002.

Bez et al., "Introduction to Flash Memory," Proceedings of the IEEE, vol. 91, No. 4, pp. 489-502, Apr. 2003.

Blahut, "Theory and Practice of Error Control Codes," Addison-Wesley, section 3.2, pp. 47-48, May 1984.

Chang, "Hybrid Solid State Disks: Combining Heterogeneous NAND Flash in Large SSDs," Presentation, ASPDAC, pp. 1-26, Jan. 2008.

Cho et al., "A 3.3V 1 GB Multi-Level NAND Flash Memory with Non-Uniform Threshold Voltage Distribution," IEEE International Solid-State Circuits Conference (ISSCC), pp. 28-29 and 424, Feb. 2001.

"Databahn TM Flash Memory Controller IP," Denali Software, Inc., pp. 1-1, year 1994, as downloaded from https://denali.com/en/products/databahn_flash.jsp.

"FlashFX Pro TM 3.1—High Performance Flash Manager for Rapid Development of Reliable Products," product information, Datalight, Inc., pp. 1-2, Nov. 16, 2006.

Duann, "SLC & MLC Hybrid," Silicon Motion, Inc., Presentation, Flash Memory Summit, Santa Clara, USA, pp. 1-18, Aug. 2008.

Eitan et al., "Can NROM, a 2-bit, Trapping Storage NVM Cell, Give a Real Challenge to Floating Gate Cells?", Proceedings of the 1999 International Conference on Solid State Devices and Materials (SSDM), pp. 522-524, year 1999.

Eitan et al., "Multilevel Flash Cells and their Trade-offs," Proceedings of the 1996 IEEE International Electron Devices Meeting (IEDM), pp. 169-172, year 1996.

Engh et al., "A Self Adaptive Programming Method with 5 mV Accuracy for Multi-Level Storage in FLASH," Proceedings of the IEEE 2002 Custom Integrated Circuits Conference, pp. 115-118, May 2002.

Goodman et al., "On-Chip ECC for Multi-Level Random Access Memories," Proceedings of the IEEE/CAM Information Theory Workshop, pp. 1-1, Jun. 1989.

Han et al., "An Intelligent Garbage Collection Algorithm for Flash Memory Storages," Proceedings of the Conference an Computational Science and its Applications—ICCSA 2006, Springer-Verlag Berlin Heidelberg, vol. 3980/2006, pp. 1019-1027, May 2006.

Han et al., "CATA: A Garbage Collection Scheme for Flash Memory File Systems," Ubiquitous Intelligence and Computing, Springer-Verlag Berlin Heidelberg, vol. 4159/2006, pp. 103-112, Aug. 2006.

Horstein, "On the Design of Signals for Sequential and Nonsequential Detection System with Feedback," IEEE Transactions on Information Theory, vol. IT-12, No. 4, pp. 448-455, Oct. 1966.

Jung et al., "A 117-mm2 3.3-V Only 128-Mb Multilevel NAND Flash Memory for Mass Storage Applications," IEEE Journal of Solid-State Circuits, vol. 31, No. 11, pp. 1575-1583, Nov. 1996.

Kawaguchi et al., "A Flash-Memory Based File System," Proceedings of the USENIX 1995 Technical Conference, pp. 155-164, year 1995 XXXXDocument attached is not identical with the document cited. Actual page numbers are 1-10XXXXX.

Kim et al., "Future Memory Technology Including Emerging New Memories," Proceedings of the 24th International Conference on Microelectronics (MIEL2004), volue 1, pp. 377-384, May 2004.

Lee et al., "Effects of Floating-Gate Interference on NAND Flash Memory Cell Operation," IEEE Electron Device Letters, vol. 23, No. 5, pp. 264-266, May 2002.

Maayan et al., "A 512 Mb NROM Flash Data Storage Memory with 8 MB/s Data Rate," Proceedings of the 2002 IEEE International Solid-State Circuits Conference (ISSCC 2002), pp. 100-101, Feb. 2002.

Mielke et al., Recovery Effects in the Distributed Cycling of Flash Memories, Proceedings of the IEEE 44th Annual International Reliability Physics Symposium, pp. 29-35, Mar. 2006.

"ONFI—Open NAND Flash Interface Specification," revision 1.0, pp. 1-106, Dec. 2006.

(56) References Cited

OTHER PUBLICATIONS

"PS8000 Controller Specification (for SD Card)," Phison Electronics Corporation, revision 1.2, document No. S-07018, pp. 1-20, Mar. 2007.
Shalvi et al., "Signal Codes," Proceedings of the 2003 IEEE Information Theory Workshop (ITW2003), pp. 1-18, Apr. 2003.
Shiozaki, "Adaptive Type-II Hybrid Broadcast ARQ System," IEEE Transactions on Communications, vol. 44, No. 4, pp. 420-422, Apr. 1996.
Suh et al., "A 3.3 V 32 Mb NAND Flash Memory with Incremental Step Pulse Programming Scheme," IEEE Journal of Solid-State Circuits, vol. 30, No. 11, pp. 1149-1156, Nov. 1995.
"Bad Block Management in NAND Flash Memories," STMicroelectronics, Application Note AN 1819, pp. 1-7, May 2004.
"Wear Leveling in Single Level Cell NAND Flash Memories," STMicroelectronics, Application Note AN1822, pp. 1-7, Feb. 2007.
Takeuchi et al., "A Double-Level-Vth Select Gate Array Architecture for Multi-Level NAND Flash Memories," Digest of Technical Papers, 1995 Symposium on VLSI Circuits, pp. 69-70, Jun. 1995.
Wu et al., "eNVy: A Non-Volatile, Main Memory Storage System," Proceedings of the 6th International Conference on Architectural Support for Programming Languages and Operating Systems, pp. 86-97, year 1994.
Takeuchi et al., "A Multipage Cell Architecture for High-Speed Programming Multilevel NAND Flash Memories", IEEE Journal of Solid-State Circuits, vol. 33, No. pp. 1228-1237, Aug. 1998.
Jedec Standard JESD84-C44, "Embedded MultiMediaCard (e-MMC) Mechanical Standard, with Optional Reset Signal", Jedec Solid State Technology Association, USA, pp. 1-13, Jul. 2009.
Jedec, "UFS Specification—Version 0.1," pp. 1-94, Nov. 11, 2009.
SD Group, Technical Committee SD Card Association, "SD Specifications Part 1—Physical Layer Specification, Version 3.01, draft 1.00," pp. 1-220, Nov. 9, 2009.
"Universal Serial Bus Specification", revision 2.0, Compaq, Hewlett, Intel, Lucent, Microsoft etc., pp. 1-650, Apr. 27, 2000.
Serial ATA International Organization, "Serial ATA Revision 3.0 Specification", pp. 1-663, Jun. 2, 2009.
Gotou, "An Experimental Confirmation of Automatic Threshold Voltage Convergence in a Flash Memory Using Alternating Word-Line Voltage Pulses", IEEE Electron Device Letters, vol. 18, No. 10, pp. 503-505, Oct. 1997.
Huffman, "Non-Volatile Memory Host Controller Interface (NVMHCI)", Specification 1.0, pp. 1-65, Apr. 14, 2008.
Panchbhai et al., "Improving Reliability of NAND Based Flash Memory Using Hybrid SLC/MLC Device—Project Proposal for CSci 8980—Advanced Storage Systems," Department of Computer Science, University of Minnesota, USA, pp. 1-4, Mar. 2009.
"M25PE16: 16-Mbit, page-erasable serial flash memory with byte-alterability, 75 MHz SPI bus, standard pinout", NUMONYX B.V., pp. 1-58, Apr. 2008.
Hong et al., "NAND Flash-based Disk Cache Using SLC/MLC Combined Flash Memory", 2010 International Workshop on Storage Network Architecture and Parallel I/Os, pp. 21-30, USA, May 3, 2010.
Engineering Windows 7, "Support and Q&A for Solid-State Drives", e7blog, pp. 1-10, May 5, 2009.
"Memory Management in NAND Flash Arrays", Technical Note 29-28, Micron Technology Inc., pp. 1-10, year 2005.
Kang et al., "A Superblock-based Flash Translation Layer for NAND Flash Memory", Proceedings of the 6th ACM & IEEE International Conference on Embedded Software, Seoul, Korea, pp. 161-170, Oct. 2006.
Park et al., "Sub-Grouped Superblock Management for High-Performance Flash Storages", IEICE Electronics Express, vol. 6, No. 6, pp. 297-303, Mar. 25, 2009.
"How to Resolve "Bad Super Block: Magic Number Wrong" in BSD", Free Online Articles Director Article Base, pp. 1-3, posted Sep. 5, 2009.
"Memory Stick Failed IO Superblock", UBUNTU Forums, pp. 1-2, posted Nov. 11, 2009.
"SD Card Failure, can't read superblock", Super User Forums, pp. 1-2, posted Aug. 8, 2010.
Tishbi, U.S. Appl. No. 17/512,712, filed Oct. 28, 2021.

\* cited by examiner

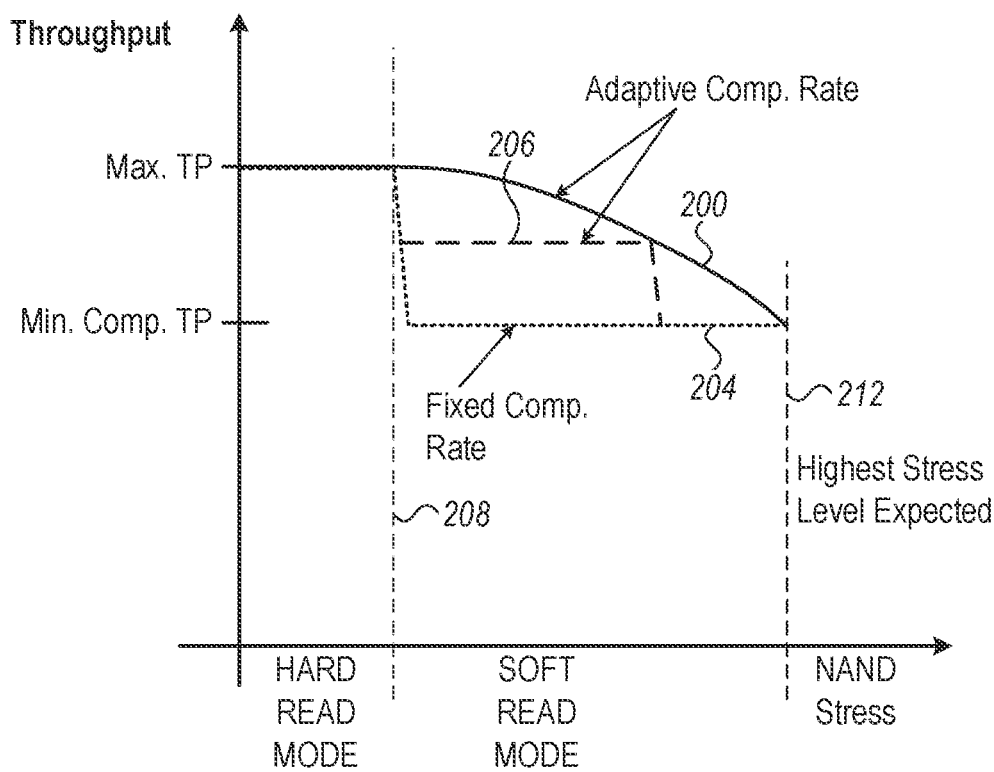
FIG. 3
FIG. 4
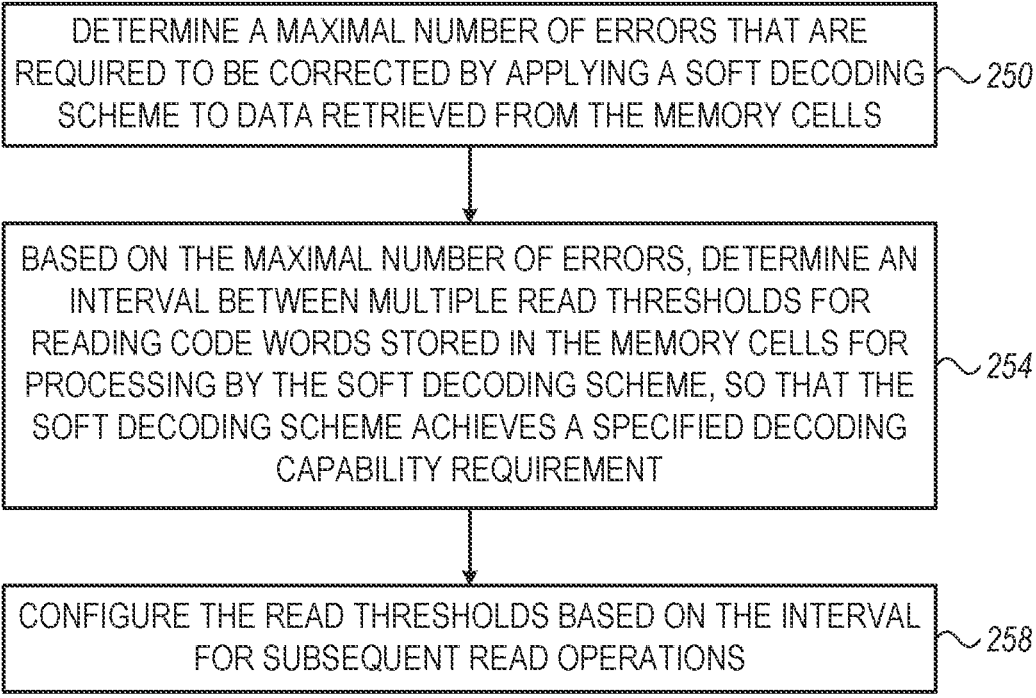

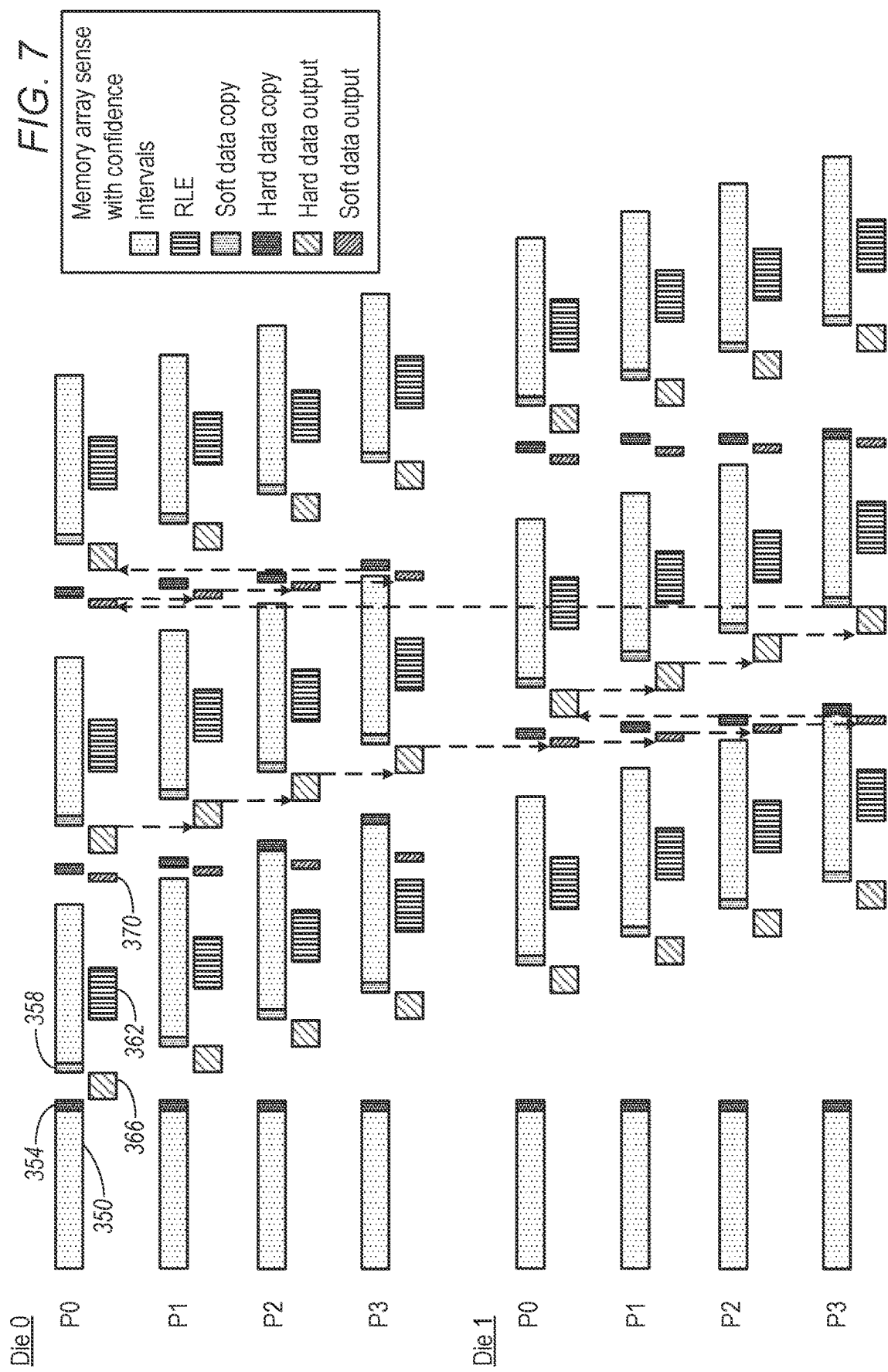

CONTROLLING MEMORY READOUT RELIABILITY AND THROUGHPUT BY ADJUSTING DISTANCE BETWEEN READ THRESHOLDS

CROSS-REFERENCE TO RELATED APPLICATIONS

This application claims the benefit of U.S. Provisional Patent Application 63/184,230, filed May 5, 2021, whose disclosure is incorporated herein by reference.

TECHNICAL FIELD

Embodiments described herein relate generally to data storage, and particularly to methods and systems for controlling memory readout reliability and throughput by adjusting a distance between read thresholds.

BACKGROUND

In various storage systems, a memory controller stores data in memory cells of a memory device. Upon reading data from the memory cells, the memory device may send to the memory controller confidence levels associated with the data bits read, to be used in soft decoding. The memory device may send the confidence levels to the memory controller in a compressed form, to reduce bandwidth on the channel between the memory device and the memory controller.

Methods for transferring compressed confidence levels are known in the art. For example, U.S. Pat. No. 9,229,861 describes a method for data storage that includes storing data in a group of analog memory cells by writing respective input storage values to the memory cells in the group. After storing the data, respective output storage values are read from the analog memory cells in the group. Respective confidence levels of the output storage values are estimated, and the confidence levels are compressed. The output storage values and the compressed confidence levels are transferred from the memory cells over an interface to a memory controller.

SUMMARY

An embodiment that is described herein provides an apparatus for data storage that includes an interface and a processor. The interface is configured to communicate with a memory device that includes (i) a plurality of memory cells and (ii) a data compression module. The processor is configured to determine a maximal number of errors that are required to be corrected by applying a soft decoding scheme to data retrieved from the memory cells, and based on the maximal number of errors, to determine an interval between multiple read thresholds for reading Code Words (CWs) stored in the memory cells for processing by the soft decoding scheme, so as to meet following conditions: (i) the soft decoding scheme achieves a specified decoding capability requirement, and (ii) a compression rate of the compression module when applied to confidence levels corresponding to readouts of the CWs, achieves a specified readout throughput requirement.

In some embodiments, the processor is configured to determine the interval by estimating multiple attainable compression rates for different respective settings of the interval, and to select a setting of the interval that meets the conditions. In other embodiments, the processor is configured to determine the interval for maximizing the readout throughput from the memory device. In yet other embodiments, the processor is configured to determine the interval for minimizing a probability of decoding failure in decoding CWs using the soft decoding scheme.

In an embodiment, the processor is configured to decide to apply to subsequent CWs read from the memory cells a hard decoding scheme or the soft decoding scheme, based on an average number of errors detected in previously read CWs. In another embodiment, the processor is configured to decide to apply the soft decoding scheme to subsequent CWs read from the memory cells, in response to detecting that a first readout throughput achievable using hard decoding is smaller than a second readout throughput achievable using soft decoding with confidence levels that were compressed by the compression module. In yet another embodiment, the processor is configured to set a data rate of the interface depending on the compression rate being configured.

In some embodiments, the processor is configured to identify low parallelism random readout operations that are not constrained by a data rate of the interface, and to set the compression module so as not to compress confidence levels of the identified readout operations. In other embodiments, the memory cells belong to multiple dies, and the processor is configured to read compressed confidence levels from a first die among the multiple dies while one or more other dies among the multiple dies are occupied in compressing local confidence levels. In yet other embodiments, the data compression module supports multiple compression configurations, and the processor is configured to select a compression configuration among the supported compression configurations that meets the readout throughput requirement.

In an embodiment, the multiple compression configurations have multiple respective constant compression rates. In another embodiment, the processor is configured to configure the data compression module to produce compressed confidence levels using a variable-rate compression configuration, and to receive the compressed confidence levels via the interface in multiple data segments having respective data lengths, in accordance with the variable-rate compression configuration. In yet another embodiment, the compression module supports a lossy compression scheme, and the processor is configured to estimate the maximal number of errors, depending on a number of errors contributed by the lossy compression scheme. In further yet another embodiment, the processor is configured to determine the interval so as to achieve a specified tradeoff between soft decoding capability and readout throughput.

There is additionally provided, in accordance with an embodiment that is described herein, a method for data storage, including, in a memory controller that communicates with a memory device that includes (i) a plurality of memory cells and (ii) a data compression module, determining a maximal number of errors that are required to be corrected by applying a soft decoding scheme to data retrieved from the memory cells. Based on the maximal number of errors, an interval between multiple read thresholds for reading Code Words (CWs) stored in the memory cells for processing by the soft decoding scheme is determined, so as to meet following conditions: (i) the soft decoding scheme achieves a specified decoding capability requirement, and (ii) a compression rate of the compression module when applied to confidence levels corresponding to readouts of the CWs, achieves a specified readout throughput requirement.

There is additionally provided, in accordance with an embodiment that is described herein, an apparatus for data storage, including an interface and a processor. The interface is configured to communicate with a memory device that includes a plurality of memory cells. The processor is configured to determine a maximal number of errors that are required to be corrected by applying a soft decoding scheme to data retrieved from the memory cells, and based on the maximal number of errors, to determine an interval between multiple read thresholds for reading Code Words (CWs) stored in the memory cells for processing by the soft decoding scheme, so that the soft decoding scheme achieves a specified decoding capability requirement.

In some embodiments, the processor is configured to determine the interval so that the soft decoding scheme aims to correct the maximal number of errors with a lowest decoding failure rate. In other embodiments, the processor is configured to determine the maximal number of errors by modeling underlying voltage distributions as Gaussian distributions and calculating the maximal number of errors based on the estimated Gaussian distributions. In yet other embodiments, the processor is configured to model the Gaussian distributions by determining a number of memory cells that fall between adjacent read thresholds, and calculating a variance parameter of the Gaussian distributions based on the estimated number of memory cells.

In an embodiment the processor is configured to determine the maximal number of errors by retrieving a CW from the memory cells using a single read threshold, decoding the retrieved CW using a hard decoding scheme for producing a decoded CW, and in response to detecting that the CW is successfully decodable using the hard decoding scheme, to calculate the maximal number of errors by comparing between the retrieved CW and the decoded CW. In another embodiment, the processor is configured to determine the interval by mapping the maximal number of errors into the interval using a predefined function. In yet another embodiment, the predefined function is based on finding, for selected numbers of errors, respective intervals that aim to maximize mutual information measures between CWs as stored in the memory cells and respective readouts of the CWs retrieved from the memory cells.

There is additionally provided, in accordance with an embodiment that is described herein, a method for data storage, including, in a memory controller that communicates with a memory device that includes a plurality of memory cells, determining a maximal number of errors that are required to be corrected by applying a soft decoding scheme to data retrieved from the memory cells. Based on the maximal number of errors, an interval between multiple read thresholds for reading Code Words (CWs) stored in the memory cells for processing by the soft decoding scheme is determined, for achieving a specified decoding capability requirement.

There is additionally provided, in accordance with an embodiment that is described herein, an apparatus for data storage, including an interface and a processor. The interface is configured to communicate with a memory device that includes (i) a plurality of memory cells and (ii) a data compression module. The processor is configured to select an interval between multiple read thresholds for reading Code Words (CWs) stored in the memory cells for processing by a soft decoding scheme, based on the selected interval, to estimate statistical properties of confidence levels corresponding to readouts of the CWs, and based on the estimated statistical properties, to determine an attainable compression rate for compressing the confidence levels, the attainable compression rate dictates a corresponding attainable readout throughput, and to configure the compression module in accordance with the attainable compression rate for transmitting the compressed confidence levels at the attainable readout throughput.

In some embodiments, the processor is configured to estimate the statistical properties by estimating a ratio between a first number of the confidence levels indicative of a low confidence level and a second overall number of the confidence levels. In other embodiments, the processor is configured to determine the attainable compression rate by mapping the ratio into the attainable compression rate using a predefined function.

There is additionally provided, in accordance with an embodiment that is described herein, method for data storage, including, in a memory controller that communicates with a memory device that includes (i) a plurality of memory cells and (ii) a data compression module, selecting an interval between multiple read thresholds for reading Code Words (CWs) stored in the memory cells for processing by a soft decoding scheme. Based on the selected interval, statistical properties of confidence levels corresponding to readouts of the CWs are estimated. Based on the estimated statistical properties, an attainable compression rate for compressing the confidence levels is determined, the attainable compression rate dictates a corresponding attainable readout throughput. The compression module is configured in accordance with the attainable compression rate for transmitting the compressed confidence levels at the attainable readout throughput.

These and other embodiments will be more fully understood from the following detailed description of the embodiments thereof, taken together with the drawings in which:

BRIEF DESCRIPTION OF THE DRAWINGS

FIG. 3 is a diagram that schematically illustrates graphs depicting attainable readout throughputs corresponding to stress levels applied to the memory device, in accordance with an embodiment that is described herein;

FIG. 4 is a flow chart that schematically illustrates a method for optimizing soft decoding capabilities by adapting an interval between read thresholds, in accordance with an embodiment that is described herein;

FIG. 7 is a diagram that schematically illustrates efficient scheduling in sending hard data and compressed confidence levels from two dies to the memory controller over a common channel, in accordance with an embodiment that is described herein.

DETAILED DESCRIPTION OF EMBODIMENTS

Overview

Figure 1:
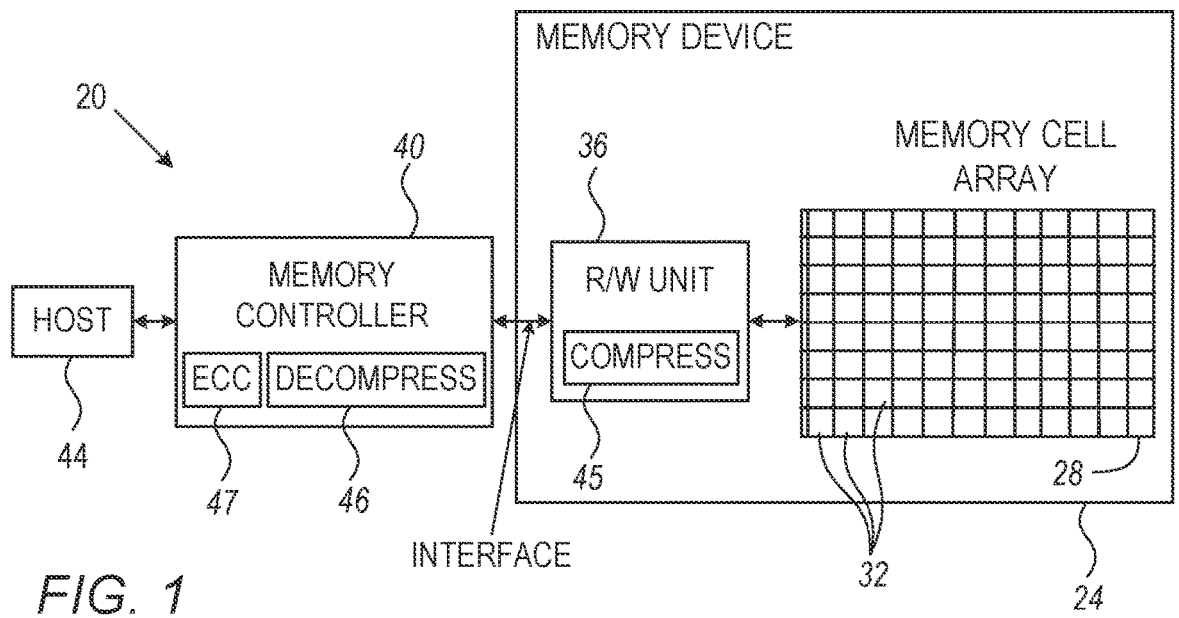
FIG. 1 is a block diagram that schematically illustrates a memory system, in accordance with an embodiment that is described herein.

Embodiments that are described herein provide methods and system for controlling readout reliability and throughput from memory cells, by adjusting a distance between read threshold.

Memory cells in a memory device may become stressed for various reasons such as aging, the number of program/erase cycles applied, retention, disturbances from neighboring memory cells and the like. As the stress level to which the memory cells are subjected increases, readout reliability degrades, and data retrieved from these memory cells may contain a larger number of errors.

To mitigate readout errors, the data is typically stored in the memory cells encoded using a suitable Error Correction Code (ECC) and decoded using the ECC upon reading to recover the unencoded data. Decoding the ECC may be carried out using various types of decoding schemes, e.g., a hard decoding scheme or a soft decoding scheme. In hard decoding, for a given position of the read threshold, a data unit is read once from a group of memory cells using the given read threshold. In soft decoding, multiple readouts are read from the same group of memory cells using respective multiple read thresholds in the vicinity of the given read threshold, and each readout is assigned corresponding confidence levels that may improve soft decoding performance. Soft decoding schemes typically have higher decoding capabilities than hard decoding schemes, meaning that soft decoding can correct a higher number of errors in a read data unit compared to hard decoding. The decoding capabilities of a soft decoding scheme depend on the positions of the read thresholds used, and more specifically on the distance between adjacent read thresholds, which distance is also referred to herein as a "sampling interval" or simply "interval" for brevity.

Typically, a larger sampling interval between the read thresholds results in better soft decoding performance. Increasing the sampling interval above a certain point may, however, result in decreasing soft decoding performance of the soft decoding scheme.

The confidence levels associated respectively with the multiple readouts are sent to the memory controller to be used by the ECC soft decoder, which may reduce the readout throughput over the interface between the memory controller and the memory device significantly. Methods for reducing the amount of data sent over the interface by applying data compression to the confidence levels on the memory side and de-compression in the memory controller side are described, for example, in U.S. Pat. No. 9,229,861, whose disclosure is incorporated herein by reference. (In the event of any inconsistencies between any incorporated document and this document, it is intended that this document control.)

As noted above, soft decoding performance and the attainable compression ratio of the confidence levels are affected by the sampling interval between the read thresholds. The attainable compression rate of the confidence levels is also affected by the number of readout errors, which may alter the statistical properties of the confidence levels, and therefore also their attainable compressibility.

As the sampling interval increases, the soft decoder may be able to correct a larger number of errors, but the attainable compression rate of the confidence levels may decrease, and vice versa. A tradeoff thus exists between readout throughput (or compression rate) and the soft decoding performance that may be measured, for example, by the number of errors that can be corrected using soft decoding, e.g., with a lowest decoding failure rate.

As will be described in detail below, in the disclosed techniques, the tradeoff between soft decoding performance and readout throughput can be controlled by adapting the sampling interval between the read thresholds used for the soft decoding. As a result, when the memory cells experience low levels of stress, modest error correction capabilities may be sufficient, which allows achieving a relatively high compression rate and therefore a high readout throughput. When the memory cells experience high levels of stress, larger soft decoding capabilities are required, in which case a low compression rate and therefore lower readout throughput may be attainable.

Consider an embodiment of an apparatus for data storage, comprising an interface and a processor. The interface is configured to communicate with a memory device that comprises (i) a plurality of memory cells and (ii) a data compression module. The processor is configured to determine a maximal number of errors that are required to be corrected by applying a soft decoding scheme to data retrieved from the memory cells, and to determine, based on the maximal number of errors, an interval between multiple read thresholds for reading Code Words (CWs) stored in the memory cells for processing by the soft decoding scheme, so as to meet following conditions: (i) the soft decoding scheme achieves a specified decoding capability requirement, and (ii) a compression rate of the compression module when applied to confidence levels corresponding to readouts of the CWs, achieves a specified readout throughput requirement.

In some embodiments, the processor determines the interval by estimating multiple attainable compression rates for different respective settings of the interval and selects a setting of the interval that meets the conditions. In other embodiments, the processor determines the interval for maximizing the readout throughput from the memory device. To maximize decoding capabilities, the processor may determine the interval for minimizing a probability of decoding failure in decoding CWs using the soft decoding scheme.

The processor applies hard decoding or soft decoding as appropriate. For example, the processor may decide to apply to subsequent CWs read from the memory cells a hard decoding scheme or the soft decoding scheme, based on an average number of errors detected in previously read CWs. In an embodiment, the processor decides to apply the soft decoding scheme to subsequent CWs read from the memory cells, in response to detecting that a first readout throughput achievable using hard decoding is smaller than a second readout throughput achievable using soft decoding with confidence levels that were compressed by the compression module. The throughput in using hard decoding may fall below the throughput in soft decoding because in response to hard decoding failure the processor may trigger additional decoding stages, resulting in increased latency. In another embodiment, the processor sets a data rate (or an operational clock frequency) of the interface depending on the compression rate being configured. For example, when the compression rate is higher, the processor may set a higher data rate to compensate for the read performance loss, at the expense of higher thermal power.

The processor may decide to apply data compression to the confidence levels depending on underlying methods used for retrieving data from one or more dies. For example, the processor may identify low parallelism random readout operations that are not constrained by a data rate of the interface, and in response, set the compression module so as not to compress the confidence levels of the identified readout operations. The compression of confidence levels often increases readout latency, and therefore it may be beneficial not to compress at low parallelism. In an embodiment in which the memory cells belong to multiple dies, the processor may read compressed confidence levels from a first die among the multiple dies while one or more other dies among the multiple dies are occupied in compressing local confidence levels.

In some embodiments, the data compression module supports multiple compression configurations, and the processor selects a compression configuration among the supported compression configurations that meets the readout throughput requirement. For example, the multiple compression configurations may have multiple respective constant compression rates.

In some embodiments, the processor configures the data compression module to produce compressed confidence levels using a variable-rate compression configuration. The processor receives the compressed confidence levels via the interface in multiple data segments having respective data lengths, in accordance with the variable-rate compression configuration.

In an embodiment in which the compression module supports a lossy compression scheme, the processor may estimate the maximal number of correctable errors (to be used for determining the interval), depending on a number of errors contributed by the lossy compression scheme.

In an embodiment, as opposed to optimizing only soft decoding performance or readout throughput alone, the processor determines the interval so as to achieve a specified tradeoff between soft decoding capability and readout throughput. For example, it may be required to reduce soft decoding performance in order to increase readout throughput.

In some embodiments, the processor determines the interval to maximize decoding capabilities, without imposing any requirements on the readout throughput. For example, the processor may determine the interval so that the soft decoding scheme aims to correct a specified maximal number of errors with a lowest decoding failure rate.

In some embodiments, the processor determines the maximal number of errors by modeling underlying voltage distributions as Gaussian distributions, and calculating the maximal number of errors based on the estimated Gaussian distributions. To model the Gaussian distributions the processor may determine a number of memory cells that fall between adjacent read thresholds and calculate a variance parameter (or a standard deviation parameter) of the Gaussian distributions based on the estimated number of memory cells.

Using soft decoding for determining the maximal number of errors is not mandatory. In alterative embodiments, the processor may perform hard decoding to a readout sampled using a single read threshold, and if hard decoding succeeds, calculate the maximal number of errors by comparing between the readouts before and after the hard decoding operation.

In an embodiment, the processor is configured to map the maximal number of errors into the interval using a predefined function. For example, the predefined function is based on finding, for selected numbers of errors, respective intervals that aim to maximize mutual information measures between CWs as stored in the memory cells and respective readouts of the CWs retrieved from the memory cells.

In some embodiments, the processor selects an interval between read thresholds using any suitable method, and determines the attainable compression for that selected interval. To this end, the processor estimates, based on the selected interval, statistical properties of confidence levels corresponding to readouts of the CWs, and based on the estimated statistical properties, determines the attainable compression rate, which also dictates a corresponding attainable readout throughput. The processor configures the compression module in accordance with the attainable compression rate for transmitting the compressed confidence levels at the attainable readout throughput.

The processor may use any suitable statistical properties of the confidence levels. In an example embodiment, the processor estimates the statistical properties by estimating a ratio between a first number of the confidence levels indicative of a low confidence level and a second overall number of the confidence levels.

In some embodiments, the processor determines the attainable compression rate by mapping the ratio into the attainable compression rate using a predefined function.

In the disclosed techniques, the interval between read thresholds is set to meet readout reliability and throughput requirements in transmitting compressed confidence levels from the memory device to the memory controller. The memory controller may monitor the stress applied to the memory cells along the lifetime of the memory device, and to adapt the interval to retain high reliability performance while gradually reducing readout throughput as the memory device ages or becoming subjected to higher stress levels. Alternatively, the memory controller may set the interval to meet a high readout reliability requirement or a high readout throughput requirement, independently.

System Description

FIG. 1 is a block diagram that schematically illustrates a memory system 20, in accordance with an embodiment that is described herein. System 20 can be used in various host systems and devices, such as in computing devices, cellular phones or other communication terminals, removable memory modules (e.g., "disk-on-key" devices), Solid State Disks (SSD), digital cameras, music and other media players and/or any other system or device in which data is stored and retrieved.

System 20 comprises a memory device 24, which stores data in a memory cell array 28. The memory cell array comprises multiple memory cells 32, e.g., analog memory cells. In the context of the present patent application and in the claims, the term "memory cell" is used to describe any memory cell that holds a continuous, analog level of a physical quantity, such as an electrical voltage or charge. Memory cell array 28 may comprise memory cells of any kind, such as, for example, NAND, NOR and CTF Flash cells, PCM, NROM, FRAM, MRAM and DRAM cells. Memory cells 32 may comprise Single-Level Cells (SLC) or Multi-Level Cells (MLC, also referred to as multi-bit cells).

The charge levels stored in the memory cells and/or the analog voltages or currents written into and read out of the memory cells are referred to herein collectively as analog values or storage values. Although the embodiments described herein mainly address threshold voltages, the methods and systems described herein may be used with any other suitable kind of storage values.

System 20 stores data in the memory cells by programming the memory cells to assume respective memory states, which are also referred to as programming levels. The programming states are selected from a finite set of possible states, and each state corresponds to a certain nominal storage value. For example, a 2 bit/cell MLC can be programmed to assume one of four possible programming states by writing one of four possible nominal storage values to the cell.

Memory device 24 comprises a reading/writing (R/W) unit 36, which converts data for storage in the memory device to storage values and writes them into memory cells 32. In alternative embodiments, the R/W unit does not perform the conversion, but is provided with voltage samples, i.e., with the storage values for storage in the cells. When reading data out of memory cell array 28, R/W unit 36 converts the storage values of memory cells 32 into digital samples having a resolution of one or more bits. The R/W unit typically reads data from memory cells 32 by comparing the storage values of the memory cells to one or more read thresholds. Data is typically written to and read from the memory cells in groups that are referred to as pages. In some embodiments, the R/W unit can erase a group of memory cells 32 by applying one or more negative erasure pulses to the memory cells.

The storage and retrieval of data in and out of memory device 24 is performed by a memory controller 40, which communicates with device 24 over a suitable interface. In some embodiments, memory controller 40 produces the storage values for storing in the memory cells and provides these values to R/W unit 36. Alternatively, memory controller 40 may provide the data for storage, and the conversion to storage values is carried out by the R/W unit internally to the memory device.

Memory controller 40 communicates with a host 44, for accepting data for storage in the memory device and for outputting data retrieved from the memory device. In some embodiments, some or even all of the functions of controller 40 may be implemented in hardware. Alternatively, controller 40 may comprise a microprocessor that runs suitable software, or a combination of hardware and software elements.

In some embodiments, R/W unit 36 comprises a data compression module 45, which compresses some of the information that is to be sent to memory controller 40. The memory controller comprises a data decompression module 46, which decompresses the compressed information received from memory device 24. In particular, R/W unit 36 may produce confidence levels of the storage values read from memory cells 32, and data compression module 45 may compress these confidence levels and send the compressed confidence levels to memory controller 40. (In some embodiments, data compression module 45 can also be used for compressing other types of information, such as stored data that is retrieved from memory cells 32.)

Memory controller 40 uses the storage values read from cells 32, and the associated confidence levels, to reconstruct the stored data. In an example embodiment, memory controller 40 comprises an Error Correction Code (ECC) module 47, which encodes the data for storage using a suitable ECC, and decodes the ECC of the data retrieved from memory cells 32. ECC module 47 may apply any suitable type of ECC, such as, for example, a Low-Density Parity Check (LDPC) code or a Bose-Chaudhuri-Hocquenghem (BCH) code. In some embodiments, ECC module 47 uses the confidence levels to improve the ECC decoding performance. Several example methods for obtaining and compressing confidence levels, as well as for using the confidence levels in ECC decoding, are described hereinbelow.

The configuration of FIG. 1 is an example system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

In the example system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the circuitry of the memory controller may reside on the same die on which the memory array is disposed. Further alternatively, some or all of the functionality of controller 40 can be implemented in software and carried out by a processor or other element of the host system. In some embodiments, host 44 and memory controller 40 may be fabricated on the same die, or on separate dies in the same device package.

In some implementations, a single memory controller may be connected to multiple memory devices 24. In yet another embodiment, some or all of the memory controller functionality may be carried out by a separate unit, referred to as a memory extension, which acts as a slave of memory device 24. Typically, memory controller 40 comprises a general-purpose processor, which is programmed in software to carry out the functions described herein. The software may be downloaded to the processor in electronic form, over a network, for example, or it may, alternatively or additionally, be provided and/or stored on tangible media, such as magnetic, optical, or electronic memory.

Memory cells 32 of memory cell array 28 are typically arranged in a grid having multiple rows and columns, commonly referred to as word lines and bit lines, respectively. The array is typically divided into multiple pages, i.e., groups of memory cells that are programmed and read simultaneously. Memory cells are typically erased in groups of word lines that are referred to as erasure blocks. In some embodiments, a given memory device comprises multiple memory cell arrays, which may be fabricated on separate dies.

Compression of Confidence Level Information

The storage values stored in memory cells 32 are often associated with varying confidence levels. In other words, when attempting to retrieve data from memory cells 32 by reading their storage values, different storage values may have different likelihoods of truly representing the data that was originally stored. The memory cells that are programmed to a given programming state typically have storage values that are distributed in accordance with a certain voltage distribution. The properties of the voltage distributions depend on various factors and impairments, such as inaccuracies in the programming process, interference from neighboring cells, aging effects, and many others.

Within a given voltage distribution, some memory cells may have higher confidence levels (i.e., high likelihood of being read correctly) while other memory cells may have lower confidence levels (i.e., higher likelihood of causing read errors). For example, R/W unit 36 typically reads the memory cells by comparing their storage values to one or more read thresholds, which are positioned between adjacent programming states. Thus, a storage value located in a boundary region between adjacent programming states has a relatively high likelihood of falling on the wrong side of a read threshold and causing a read error. A storage value located in the middle of the distribution can usually be regarded as reliable.

In some embodiments, memory controller 40 uses estimates of these confidence levels to improve the performance of the data readout process. For example, in some embodiments, ECC module 47 decodes the ECC by operating on soft metrics, such as Log Likelihood Ratios (LLRs) of the read storage values or of individual bits represented by these storage values. As another example, some of the storage values that are regarded as unreliable or uncertain may be marked as erasures to the ECC module. Estimated confidence levels of the read storage values can be used to mark certain storage values as erasures, and/or to produce soft metrics. Soft metrics, erasures and/or any other suitable metrics that assist the ECC module in decoding the ECC are referred to herein as ECC metrics. Additionally or alternatively, the confidence levels can be used in any suitable way to reconstruct the stored data.

The confidence levels of the storage values can be estimated in various ways. In some embodiments, R/W unit retrieves data from a group of memory cells 32 by comparing their storage values to one or more read thresholds. The R/W unit estimates the confidence levels of these storage values by re-reading the memory cells with a different set of read thresholds, which are positioned so as to identify storage values that are located in boundary regions between adjacent programming states.

As noted above, ECC module 47 in memory controller 40 decodes the ECC based on the estimated confidence levels of the read storage values. In order to provide this information to ECC module 47, R/W unit 36 transfers the estimated confidence levels from memory device 24 to memory controller 40 over the interface that connects the two devices. As can be appreciated, the additional communication volume created by transferring the estimated confidence levels is high, reduces the readout throughput, and may even be unfeasible.

In order to reduce the communication volume between the memory device and the memory controller (or otherwise between the memory cells and the ECC decoder), R/W unit 36 compresses the estimated confidence levels before transferring them to the memory controller. The term "data compression" (or simply "compression" for brevity) in this context typically means any process that reduces the communication rate or bandwidth that is used for transferring the estimated confidence levels. Compression may be lossless (i.e., required to maintain the original confidence level values without error) or lossy (i.e., allows a certain error probability due to the compression and decompression process).

R/W unit 36 may compress the estimated confidence levels using any suitable compression scheme. For example, instead of transferring a sequence of estimated confidence levels, the R/W unit may transfer the run lengths of the sequence, i.e., the numbers of successive "0" and "1" runs in the sequence. This compression scheme is commonly known as run-length coding.

Controlling Memory Readout Reliability and Throughput

Data compression may be applied to confidence levels derived from multiple readouts retrieved from the same group of memory cells, wherein the multiple readouts are retrieved from the memory cells using multiple distinct read thresholds. In the present context and in the claims, the distance between adjacent read thresholds is also referred to as a "sampling interval" or simply "interval" for brevity.

For a certain stress level, the interval between read thresholds that are used for soft decoding may be set to an optimal interval that attains highest soft decoding performance. In some embodiments, to optimize error correction capability in soft decoding, the memory controller continuously monitors the stress level (the stress level may be measured by the average number of errors in the read data), calculates the optimal sampling interval between the read thresholds, and sets the read thresholds in accordance with the optimal sampling interval for subsequent read operations. In this manner, it is possible to maintain near-optimal decoding performance over varying stress conditions (e.g., while ignoring any readout throughput requirement).

Sending the confidence levels in a compressed form (rather than the raw confidence levels) reduces the data volume transferred from the memory device to the memory controller over the interface that connects between them. Higher compression rates are typically desirable because they result in higher readout throughputs.

Applying data compression to the confidence levels can improve the readout throughput only up to a certain maximal readout throughput, because the compression module has limited compression capabilities that depend on the underlying compression scheme used, and on statistical properties of the confidence levels to be compressed. In general, the statistical properties of the confidence levels depend on the average number of errors in the data read, and on the interval between the read thresholds used for soft decoding.

The interval between the read thresholds thus affects both soft decoding performance and the attainable compression rate of the confidence levels. Typically, increasing the interval results in higher soft decoding capabilities but on the other hand reduces the attainable compression rate and the readout throughput. For example, Let INT1 denote an optimal interval between the read thresholds. INT1 may be set for correcting an average number N1 of readout errors expected towards the end of life of the memory device, with a minimal probability of decoding failure.

At some time prior to the end of life, the actual average number of readout errors may be N2<N1. If at that time the interval INT2 is set equal to INT1, the attainable compression rate may be smaller than the compression rate that would be attainable with an interval INT2 that is optimal for correcting N2<N1 errors (with INT2<INT1). This means that depending on the present stress level, the interval between the read thresholds may be adjusted so that soft decoding capabilities are reduced to a minimal level necessary for reliable readout, while achieving the highest compression rate and therefore the highest readout throughput under these conditions.

Figure 2:
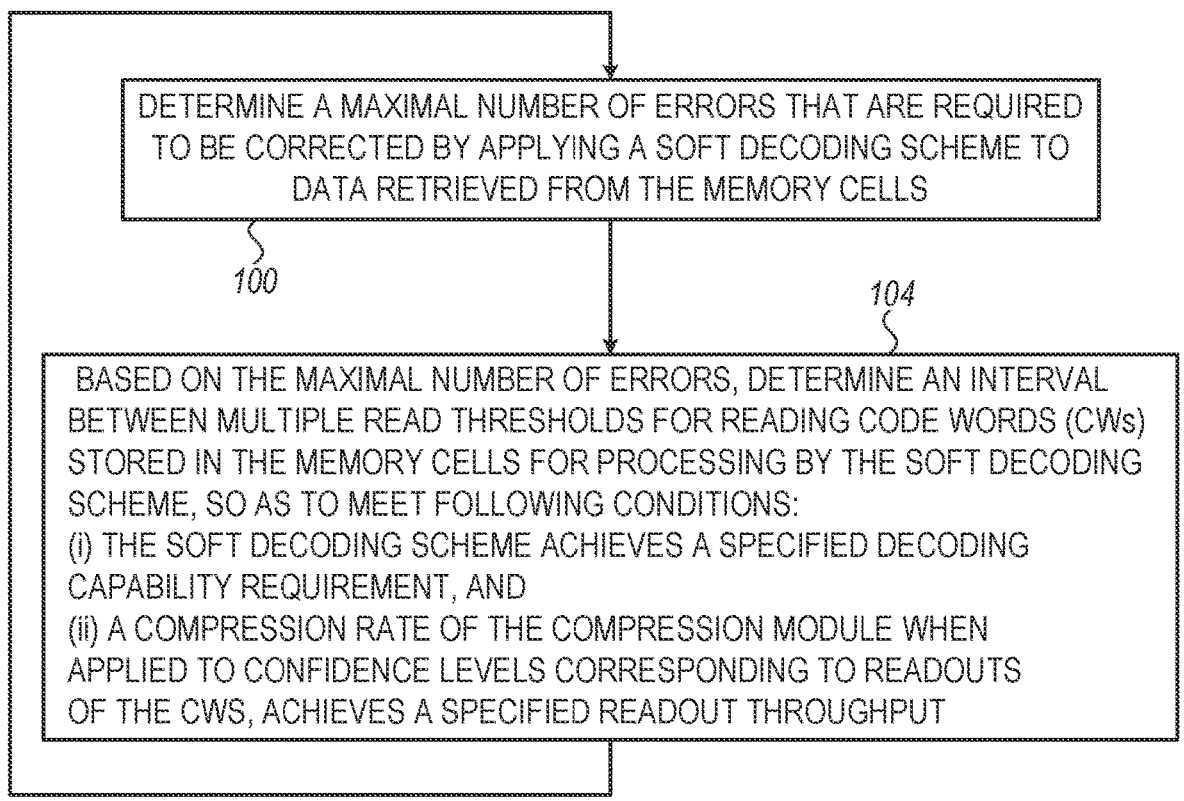
FIG. 2 is a flow chart that schematically illustrates a method for adjusting the interval between read thresholds for meeting soft decoding and readout throughput requirements, in accordance with an embodiment that is described herein.

FIG. 2 is a flow chart that schematically illustrates a method for adjusting the interval between read thresholds for meeting soft decoding and readout throughput requirements, in accordance with an embodiment that is described herein. The method will be described as executed by memory controller 40.

The method begins at a decoding requirement stage 100, with memory controller 40 determining a maximal number of errors that are required to be corrected by applying a soft decoding scheme to data retrieved from the memory cells.

The memory controller may determine the maximal number of errors, e.g., based on measuring an average number of errors detected in previously read data. The maximal number of errors reflects the health state or the stress level of the memory cells, and is typically expected to increase as the memory device ages. In some embodiments, the memory controller determines the maximal number of errors by estimating the average number of errors at the present stress level. The memory controller may estimate the average number of errors based on retrieving one or more previously stored CWs. In alternative embodiments, the memory controller may estimate the average number of errors based on the confidence levels as will be described below.

At an interval setting stage 104, the memory controller determines, based on the maximal number of errors, an interval between adjacent read thresholds for reading CWs to be processed using a soft decoding scheme, so as to meet the following conditions: (i) the soft decoding scheme achieves a specified decoding capability requirement, and (ii) a compression rate of the compression module when applied to confidence levels corresponding to readouts of the CWs, achieves a specified readout throughput. Following stage 104 the method loops back to stage 100 to determine another maximal number of errors.

The memory controller may determine the interval between the read thresholds by estimating multiple attainable compression rates for different respective settings of the interval between the read thresholds, and to select a setting of the interval that meets the conditions. In an embodiment, the throughput requirement may specify maximizing the readout throughput from the memory device (by maximizing the attainable compression rate).

In some embodiments, the processor may read data from the memory cells in a hard reading mode or in a soft reading mode. In a hard reading mode, a single read threshold is used for producing a single readout that is decoded using a suitable hard decoding scheme. In the soft reading mode, multiple reading thresholds are used for producing multiple respective readouts. Based on the multiple readouts, confidence levels are produces in the memory device, and are typically transferred to the memory controller in a compressed form.

The memory controller may switch between the hard and soft reading modes, e.g., based on the prevailing conditions of the memory cells. The soft reading mode can be invoked, for example, in response to the memory controller detecting that the number of errors exceeds the error correction capability attainable using hard decoding, or in response to detecting that the readout throughput drops below a throughput that is attainable in the soft reading mode. In this manner, the degradation in readout throughput (the degradation is associated with transferring compressed confidence levels to the memory device) can be minimized depending on the state of life (or stress level) of the memory device. In some embodiments, memory controller 40 of memory system 20 supports switching between the hard reading mode and the soft reading mode, e.g., based on the state of the memory device.

In some embodiments, when the memory device is at a state close to start of life, data read from memory cells is still highly reliable, and therefore using the hard reading mode with a low-complexity hard decoder is sufficient. As the memory device ages, the readout reliability degrades, and soft decoding may be required for coping with the increased error rate.

In some embodiments, the memory controller decides to apply to subsequent data read from the memory cells a hard decoding scheme or the soft decoding scheme, based on an average number of errors detected in previously read data (CWs). In some embodiments, the memory controller decides to apply the soft decoding scheme to subsequent data read from the memory device, in response to detecting that a first readout throughput achievable using hard decoding is smaller than a second readout throughput achievable using soft decoding with confidence levels that were compressed by the compression module.

The compressed confidence levels are typically transferred to the memory controller over the interface with some latency. Such latency may be controlled, for example, by the processor properly setting the data rate of the interface depending on the compression rate. For example, for a lower compression rate, the memory controller configures the interface to a higher data rate, and vice versa. To this end, in an embodiment, the memory controller increases the bus frequency (and therefore the data rate over the interface) when data compression is applied to the confidence levels, in order to compensate for additional compressed data transferred over the bus.

In another embodiment, the memory controller identifies low parallelism random readout operations that are not constrained by the data rate of the interface, and sets the compression module so as not to compress the confidence levels of the identified readout operations. In this embodiment, the confidence levels of the identified readout operation are transferred to the memory controller uncompressed.

In a multi-die memory device, the latency incurred by applying data compression to the confidence levels can be "hidden" by properly ordering the readout operations from the different dies. In an embodiment, the memory controller reads compressed confidence levels from a first die among the multiple dies while one or more other dies among the multiple dies are occupied in compressing local confidence levels. An efficient task scheduling of this sort for a two-die memory system will be described below with reference to FIG. 7.

In some embodiments, data compression module 45 supports multiple compression configurations. In such embodiments, the memory controller may select a compression configuration among the supported compression configurations that meets the throughput requirement. For example, the multiple compression configurations may have multiple respective constant compression rates. When two or more compression configurations meet the throughput requirement, the processor may select among these compression configurations based on any other suitable criterion such as, for example, minimal latency.

In some embodiments, the data compression module comprises a variable-rate compression configuration. In such embodiments, the memory controller receives the compressed confidence levels via the interface in multiple data segments having respective data lengths, in accordance with the variable-rate compression configuration. Operating in a variable-rate compression configuration may require coordination between the memory controller and the memory device in transferring the compressed confidence levels. In some embodiments, in memory systems operating with compression schemes having respective fixed compression rates, it may be required to switch among the different compression schemes so as to utilize the compression scheme that maximizes the compression rate in a given state of the memory device.

In some embodiments, the memory controller estimates the attainable compression rate, programs the desired compression scheme in the memory device, and requests transmission of a specific data size in order to spare bandwidth and optimize performance. In such embodiments, a gradual decrease is achieved in the readout throughput as the stress level on the memory device increases. The memory controller may estimate the attainable compression rate based, for example, on the number of measured errors and on the sampling interval between adjacent read thresholds, in an embodiment. In another embodiment, the memory controller may estimate the attainable compression ratio by direct evaluation of the statistical properties of the confidence levels based on the number of memory cells falling between read thresholds.

FIG. 3 is a diagram that schematically illustrates graphs depicting attainable readout throughputs corresponding to stress levels applied to the memory device, in accordance with an embodiment that is described herein.

In graphs 200, 204 and 206 of FIG. 3, the horizontal axis corresponds to stress levels applied to the memory cells (e.g., measured as the average number of readout errors), and the vertical axis corresponds to readout throughput from the memory device. Graphs 200 and 206 correspond to embodiments in which the memory device supports variable-rate compression, and the interval between the read thresholds is adapted to meet error correction and readout throughput requirements, as described above. Graph 204 corresponds to a compression scheme in which no compression is applied in the hard decoding mode, and a single fixed-rate compression is applied in soft decoding mode.

A vertical dotted line 208 separates between low stress levels that require hard decoding, and high stress levels that require soft decoding. For stress levels below line 208 operating in the hard reading mode with hard decoding is sufficiently reliable. For stress levels above line 208 operating in the soft reading mode with a suitable soft decoding scheme is required for reliable decoding. It is also assumed that when using soft decoding, the confidence levels are transferred to the memory controller in a compressed form.

In the range of stress levels below line 208, the memory device transfers to the memory controller only hard data but no confidence levels. Consequently, the memory system achieves a maximal readout throughput denoted Max. TP. When soft decoding is applied, and the interval is set optimal for a highest expected stress level (indicated using vertical dotted line 212), the readout throughput drops to a value denoted Min. Comp. TP, because the compressed confidence values that are transferred over the interface require additional bandwidth. As shown in the figure, when soft decoding is applied and the readout thresholds are adjusted to meet the error correction and readout throughput requirements, the readout throughput in graph 200 reduces gradually with increasing the stress level. This behavior is desirable, compared to a sharp degradation in the throughput as seen in graphs 204 and 206.

As described above, the data compression module may support multiple data compression configurations having different respective constant compression rates. For example, lines 204 (nonadaptive scheme) and 206 (adaptive scheme) correspond to two different fixed-rate compression configurations. In this example, when switching from hard decoding mode to soft decoding mode, the highest attainable compression rate corresponds to the horizontal line of graph 206. As the stress level increases, the memory controller may need to increase the sampling interval and switch to a compression rate indicated by the horizontal line of graph 204, which is lower than that of graph 206.

Methods for Adjusting the Interval Between Read Thresholds for Maximizing Soft Decoding Capability FIG. 4 is a flow chart that schematically illustrates a method for optimizing soft decoding capabilities by adapting an interval between read thresholds, in accordance with an embodiment that is described herein. The method will be described as executed by memory controller 40.

The method begins at a decoding requirement stage 250, with memory controller 40 determining a maximal number of errors that are required to be corrected by applying a soft decoding scheme to data retrieved from the memory cells. Stage 250 is essentially similar to stage 100 of the method of FIG. 2 above. The maximal number of errors typically reflects the stress level applied to the memory cells.

At an interval setting stage 254, the memory controller determines, based on the maximal number of errors, an interval between multiple read thresholds for reading Code Words (CWs) stored in the memory cells for processing by the soft decoding scheme, so as to achieve a specified decoding capability requirement. In some embodiments, as will be described with reference to FIG. 5 below, the memory controller determines an optimal interval between the read thresholds so that the soft decoding scheme aims to correct the maximal number of errors with a lowest decoding failure rate.

In some embodiments, the memory controller determines the interval at stage 254 independently of any previous settings of the interval. In other embodiments, the memory controller stores one or more previous values of the interval and uses the stored interval values together with the present interval value to determine a final interval value to be set. For example, the memory controller applies a smoothing filter or a control loop to the previous and present interval values so as to smooth among the interval values along multiple setting operations of the interval. At a read thresholds setting stage 258, the memory controller configures the read thresholds based on the interval of stage 254 for subsequent read operations. Following stage 258 the method terminates.

Methods for Determining an Optimal Interval Between Read Thresholds

Next is described in detail a method for determining an optimal interval between read thresholds for a given stress level imposed on the memory cells.

Figure 5:
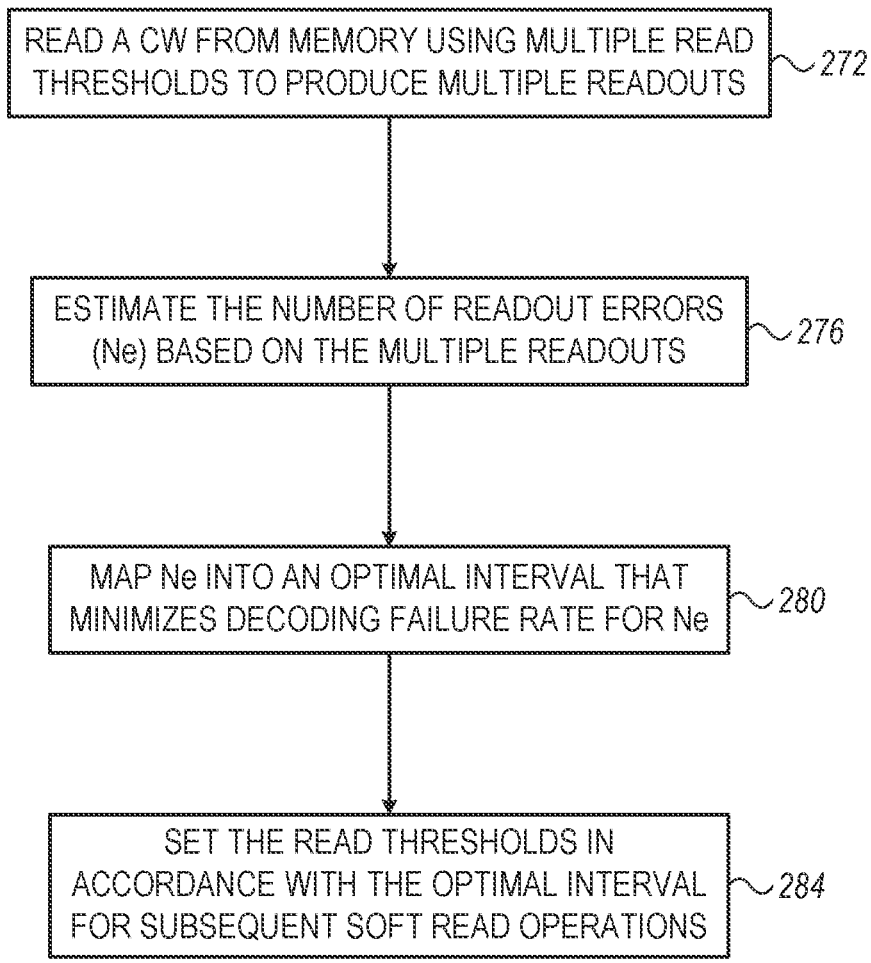
FIG. 5 is a flow chart that schematically illustrates a method for determining an interval between read thresholds that is optimal for a given stress level, in accordance with an embodiment that is described herein.

FIG. 5 is a flow chart that schematically illustrates a method for determining an interval between read thresholds that is optimal for a given stress level, in accordance with an embodiment that is described herein.

In some embodiments, the method of FIG. 5 may be used in implementing stage 254 of the method of FIG. 4 above, when the soft decoding requirement specifies to maximize the decoding performance.

The method begins with the memory controller reading a CW from a group of memory cells using multiple read thresholds, to produce multiple respective readouts, at a soft reading stage 272. In an embodiment, the multiple read thresholds may be centered about an optimal read threshold.

At a number of errors estimation stage 276, the memory controller estimates the number of errors (Ne). The estimation of Ne may be based, for example, on estimating the underlying voltage distributions, as will be described in detail below. Methods for implementing stage 276 will be described in detail further below.

Following stage 276, the average number of errors Ne is available, and the memory controller proceeds to an optimal interval determination stage 280. Ne of stage 268 or 276 may be used as the maximal number of errors, in some embodiments described above. At stage 280, the memory controller maps the number of errors Ne into an optimal interval that minimizes decoding failure rate for Ne. In some embodiments, optimal interval values for respective Ne values are determined beforehand and used at stage 280, e.g., in the form of a formulated function or a lookup table.

At an interval setting stage 284, the memory controller sets the read thresholds with the optimal interval for subsequent soft read operations. In some embodiments, multiple optimal interval values that are produced at stage 280 are subjected to a smoothing process, and the resulting smoothed interval is used as the optimal interval at stage 284. Following stage 284 the method terminates.

Next is described a method for implementing the estimation of the average number of errors of stage 276. It is assumed that the CW is read from a page of a given bit significance value. For example, in a TLC device, the CW may be stored in one of three page-types denoted a Least Significance Bit (LSB) page, a Most Significant Bit (MSB) page and an Upper Significance Bit (USB) page.

A middle range (or a zone) of threshold voltages between adjacent PVs is sometimes denoted a "Read Voltage" (RV). For reading data from the memory cells, the memory controller typically sets one or more read thresholds for selected RVs, depending on the underlying page type. For example, for reading a LSB page the memory controller may set one or more read thresholds for a single RV, whereas in reading a MSB or a USB page, the memory controller may set multiple read thresholds in each of multiple relevant RVs. In the present example, for a memory device that stores data in M programming states (PVs), the memory controller may set for an $m^{th}$ RV (denoted RVm, m=1 ... M−1) two read thresholds denoted $T1_m$ and $T2_m$ ($T1_m < T2_m$).

To estimate the number of errors (Ne) the memory controller models the underlying voltage distributions. In the present example, the $m^{th}$ voltage distribution (m=0 ... M−1) is modeled as a Gaussian distribution given by:

$$f_m(v) = \frac{1}{\sqrt{2\pi\sigma_m^2}} \exp\left[\exp\left(-\frac{(v-\mu_m)^2}{2\sigma_m^2}\right)\right] \quad \text{Equation 1}$$

In Equation 1, $\mu_m$ denotes the $m^{th}$ nominal programming voltage PVm, and $\sigma_m^2$ denotes the variance parameter of the $m^{th}$ distribution about PVm. Since the nominal programming voltages are known, it is sufficient to estimate the variances (or standard deviations) to determine the Gaussian distributions.

In some embodiments, for RVm, the memory controller estimates the number of memory cells (denoted $NC_{RVm}$) falling between $T1_m$ and $T2_m$, and uses $NC_{RVm}$ to solve Equation 2 below for $\sigma_m$.

Let RD1 and RD2 denote readouts corresponding to read thresholds $T1_m$ and $T2_m$, respectively. In an embodiment, the memory controller estimates $NC_{RVm}$ by performing a logical XOR operation between RD1 and RD2, and counting the number of '1' values in the outcome of the XOR operation. Next, the memory controller estimates $\sigma_m$ by solving the following equation:

$$NC_{RVm} = \frac{1}{M}\left[Q\left(\frac{T1_m - \mu_{m-1}}{\sigma_m}\right) - Q\left(\frac{T2_m - \mu_{m-1}}{\sigma_m}\right) + Q\left(\frac{\mu_m - T2_m}{\sigma_m}\right) - Q\left(\frac{\mu_m - T1_m}{\sigma_m}\right)\right] \quad \text{Equation 2}$$

wherein in Equation 2:

M denotes the total number of PVs, e.g., M=8 for a TLC device.

m=0 ... M−1 denotes the $m^{th}$ PV.

RVm for m=1 ... M−1 denotes the index of the RV corresponding to the zone between PVm and PVm−1.

$\mu_m$ and $\mu_{m-1}$ denote the nominal programming voltages of PVm and PVm−1.

$\sigma_m$ denotes a common standard deviation of the Gaussian distributions corresponding to PVm and PVm−1.

$T1_m$ and $T2_m$ denote the left side and right side read threshold used for RVm.

$NC_{RVm}$ denotes the number of memory cells falling between read thresholds $T1_m$ and $T2_m$.

Q(•) is the tail distribution function of the standard normal distribution, also known as the Q-function.

As noted above, for certain page types, the memory device reads a CW by setting $T1_m$ and $T2_m$ for multiple m values of RVm. In this case the number of memory cells between two read thresholds corresponds to multiple RVs and should be divided among the RVs before solving Equation 2 for a specific RVm. In one embodiment, the memory controller divides the number of memory cells evenly among the relevant RVs. In another embodiment, the memory controller divides the number of memory cells in accordance with a predefined ratio among the relevant RVs.

In some embodiments, the memory controller solves Equation 2 numerically for estimating $\sigma_m$. Using the estimated Gaussian distributions $f_m(v)$ and $f_{m-1}(v)$, the memory controller estimates the number of errors Ne (m) for each relevant RVm, and maps Ne (m) into the optimal interval between $T1_m$ and $T2_m$. It should be noted that in general, different optimal intervals may be determined for different RVs.

In some embodiments, the mapping of Ne (m) into the interval between the read thresholds is determined beforehand, e.g., based on evaluating the Mutual Information between the bits of the stored CW and the corresponding quantized voltages read from the corresponding memory cells.

In the fields of probability theory and information theory, the mutual information measure quantifies the "amount of information" (e.g., in units of bits) obtained about one random variable by observing the other random variable. In the present context, the mutual information measures the amount of information obtained on the correct CW bits as stored, by observing the CW bits retrieved from the memory device.

The mutual information depends on the interval between read thresholds and reaches a maximal value for a certain interval value. The interval value that maximizes the mutual information results in minimizing the probability of decoding failure for Ne and is therefore considered an "optimal interval." The mapping of Ne to the optimal interval can be derived by tabulating for several values of the number of errors respective optimal intervals. Alternatively, the mapping function may be implemented using any suitable form.

In some embodiments, the compression module implements a lossy compression scheme. In such embodiments, the compression operation applied to the confidence levels may increase the number of errors to be corrected. In an embodiment, the memory controller takes into consideration the average number of errors (Ne) and the number errors expected to be caused by the lossy compression scheme, in mapping the number of errors to the optimal interval.

Methods for Estimating an Attainable Compression Rate Given an Interval Between Read Thresholds The confidence levels of a given CW typically have a large number of high confidence values and a much lower number of low confidence values. The attainable compression rate of the confidence levels typically dependents on the statistical properties of the confidence levels, which in turn depend on the interval between the read thresholds and on the underlying voltage distributions about the PVs. By modeling the underlying voltage distributions, and for a selected interval, the memory controller can estimate the attainable compression rate, as described herein.

When a CW is read using read thresholds $T1_m$ and $T2_m$ per RVm, the corresponding confidence levels are indicative of a high confidence level (a '0' value) for memory cells that fall below $T1_m$ and above $T2_m$, and are indicative of a low confidence level ('1' value) for memory cells that fall between $T1_m$ and $T2_m$. A useful statistical property of the confidence levels is the ratio between the number of '1' values and the overall number of memory cells in the sequence of confidence levels. This ratio is denoted R1 and is also referred to herein as a "ones ratio."

Typically, a sequence of confidence levels having a low-valued ones-to-zero ratio has relatively long contiguous subsequences of zeros, and is therefore better compressible than a sequence of confidence level having a high-valued ones ratio.

When the interval between the read thresholds decreases, R1 decreases and the attainable compression rate increases. On the other hand, when the interval between the read thresholds increases, R1 increases, and the attainable compression rate decreases. Consequently, the attainable compression rate increases with decreasing the interval, and vice versa.

In some embodiments, the memory controller estimates R1 directly by counting the number of memory cells falling in the inner-zone, e.g., by applying a logical bitwise XOR operation between readouts corresponding to $T1_m$ and $T2_m$).

In other embodiments, the memory controller estimates the ones ratio as given by:

$$R1 = \frac{|\mathbb{p}|}{M} \sum_{m \in \mathbb{p}} \left[ Q\left(\frac{T1_m - \mu_{m-1}}{\sigma_m}\right) - Q\left(\frac{T2_m - \mu_{m-1}}{\sigma_m}\right) + Q\left(\frac{\mu_m - T2_m}{\sigma_m}\right) - Q\left(\frac{\mu_m - T1_m}{\sigma_m}\right) \right] \quad \text{Equation 3}$$

wherein in Equation 3:
M denotes the total number of PVs, e.g., M=8 for a TLC device.
m=0 . . . M−1 denotes the $m^{th}$ PV.
$\mathbb{p}$ denotes the set of RVs (RVm for selected m values) participating in reading the underlying CW, and $|\mathbb{p}|$ denotes the cardinality of $\mathbb{p}$.
$\mu_m$ and $\mu_{m-1}$ denote the nominal programming voltages of PVm and PVm−1.
$T1_m$ and $T2_m$ denote the left side and right side read threshold used for RVm.
Q(•) is the tail distribution function of the standard normal distribution, also known as the Q-function.
It is assumed that prior to applying Equation 3, the memory controller has estimated the underlying voltage distributions, e.g., Gaussian distributions in the present example, meaning that $\mu_m$, $\mu_{m-1}$ and $\sigma_m$ are known. The memory controller may estimate the voltage distributions, for example, using the methods described above that make use of Equation 2.

In an embodiment the processor may determine the maximal number of errors using an alternative method to the one described above. In the alternative embodiment, the memory controller estimates the maximal number of errors by retrieving a CW from the memory cells using a single read threshold, decoding the retrieved CW using a hard decoding scheme for producing a decoded CW, and in response to detecting that the CW is successfully decodable using the hard decoding scheme, calculating the maximal number of errors by comparing between the retrieved CW and the decoded CW.

Figure 6:
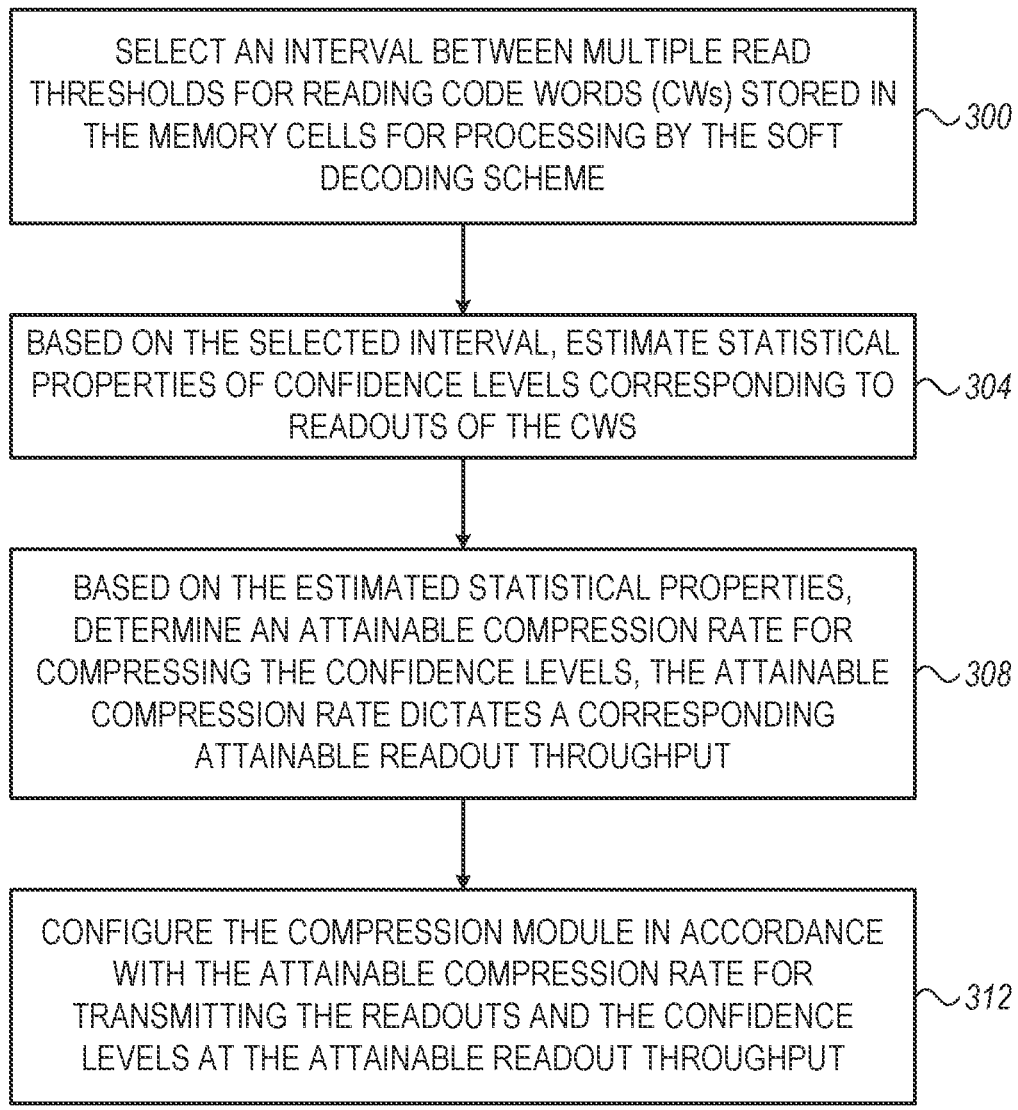
FIG. 6 is a flow chart that schematically illustrates a method for estimating the attainable compression rate of confidence levels depending on the interval between read thresholds, in accordance with an embodiment that is described herein.

FIG. 6 is a flow chart that schematically illustrates a method for estimating the attainable compression rate of confidence levels depending on the interval between read thresholds, in accordance with an embodiment that is described herein.

When the memory controller estimates R1 using Equation 3 above, it is assumed that before or during execution of the present method, memory controller 40 estimates the underlying voltage distributions, as described above.

The method of FIG. 6 begins with memory controller 40 selecting an interval between read thresholds for reading CWs stored in the memory cells for processing by a soft decoding scheme, at an interval selection stage 300. The memory device produces from multiple readouts of a CW, confidence levels that the memory controller uses in decoding the CW using a soft decoding scheme. The memory controller may select the interval using any suitable method. For example, in one embodiment, the memory controller selects an optimal interval for a given stress level using the method of FIG. 5. In other embodiments, the memory controller may select an interval shorter than the optimal interval, e.g., for increasing the attainable compression rate while compromising on reduced soft decoding capabilities.

Based on the interval selected at stage 300, the memory controller estimates statistical properties of the confidence levels corresponding the retrieved CW, at a statistical-properties estimation stage 304. For example, the memory controller determines $T1_m$ and $T2_m$ based on the interval, and assuming having modeled the underlying voltage distributions, calculates R1, e.g., using Equation 3 above.

At an attainable compression rate determination stage 308, based on the estimated statistical properties (e.g., R1 of Equation 3), the memory controller determines an attainable compression rate for compressing the confidence levels, the attainable compression rate corresponds to an attainable readout throughput. In some embodiments, the memory controller maps the ones ratio R1 to the attainable compression rate using a predefined mapping or function. The mapping depends on the underlying compression scheme and is determined beforehand.

At a compression configuration stage 312, the memory controller configures the compression module in the memory device, in accordance with the attainable compression rate for transmitting the confidence levels at (or close to) the attainable readout throughput. When the compression scheme is a variable-rate compression scheme, the memory controller configures the memory device to transmit the compressed confidence levels with a size limitation of the transactions. When the compression scheme is based on multiple fixed-rate compression schemes, the memory controller selects a suitable fixed-rate scheme that achieves the attainable compression rate. Following stage 312 the method terminates.

Efficient Task Scheduling in a Multi-Die Memory System

FIG. 7 is a diagram that schematically illustrates efficient scheduling in sending hard data and compressed confidence levels from two dies to the memory controller over a common channel, in accordance with an embodiment that is described herein. In describing FIG. 7 it is assumed that two dies denoted "Die 0" and "Die 1" are connected to a memory controller via a common channel (e.g., a bus or link).

In FIG. 7, tasks are depicted as blocks whose lengths represent respective durations of these tasks. In addition, when a second task occurs after a first task, the second task is depicted to the right of the first task.

Tasks related to a Die 0 are depicted in the upper part of the figure, and tasks related to Die 1 are depicted in the lower part of the figure. In the present example, each of the two dies comprises four planes denoted P0 . . . P3. Alternatively, other number of planes per die can also be used. Each of Die 0 and Die 1 is operated in an independent plane interleaving mode to maximize performance. In this mode, the memory device supports independent read operations across multiple planes (independent both in time and in address spaces). Throughput may be maximized in this mode, by proper scheduling of reading from the different planes.

The memory controller reads data from Die 0 and Die 1 over the common channel. The various task types in FIG. 7 are summarized herein. In the figure, repeating tasks are numbered only once for the sake of clarity. Task 350 refers to memory array sensing with confidence intervals from one plane. Tasks 354 and 358 refer respectively to copying hard data and soft data to the output buffer of the memory device. Task 362 refers to compression of soft data. Tasks 366 and 370 respectively refer to outputting hard data and soft data to the memory controller.

In some embodiments, memory controller 40 starts a read operation by sending one or commands indicating to the memory device to read a CW (or multiple CWs) from a selected plane of Die 0 or Die 1, using one or more read thresholds. In case of soft decoding, the memory controller may indicate to the memory device multiple read thresholds to be used, e.g., having a selected interval between adjacent read thresholds. In response to the command(s) the memory device produces hard data and corresponding soft data (e.g., confidence levels) and sends the hard data and the soft data to the memory controller, for decoding the CW in question.

As shown in the figure, the memory device sends the hard data and corresponding soft data to the memory controller at different time slots. In the present example, the memory device sequentially transmits the hard data from P0 up to P3, and later sequentially transmits the soft data from P0 up to P3. This scheduling order is given by way of example, and in alternative embodiments other suitable orders and schedules can also be used.

As shown in the figure, the data compression duration (RLE) is very long, e.g., can be even longer than the time duration it would have taken to transfer to the memory controller the soft data uncompressed.

As can be seen, the memory system queues operations within the memory device so that data compression operations in one die will be performed in parallel to outputting data by the other die, for efficient utilization of the channel.

The resulting periodic order of outputting data from the memory device to the memory controller is given as:
Output hard data from Die 0.
Output soft data from Die 1 (the memory controller decodes four CWs read from P0 . . . P3 of Die 1, and purges previously stored hard data).
Output hard data from Die 1.
Output soft data from Die 0 (the memory controller decodes four CWs read from P0 . . . P3 of Die 0, and purges previously stored hard data).

A cycle that follows such an output sequence is depicted in the figure using dotted-line arrows. In alternative embodiments, other efficient output sequences can also be used.

Using the scheduling of tasks depicted in FIG. 7, the memory controller requires sufficient buffering area to store two full dies worth of data (to store pages read from the two dies across all planes), so that the common channel from the two dies to the memory controller is utilized continuously. Storage space in the memory controller may be further saved by applying various scheduling schemes with improved optimization by trading-off performance.

Although FIG. 7 refers to an embodiment having a single channel shared by two dies, in other embodiments, the scheduling used in FIG. 7 may be extended to support more than two dies. Moreover, in a memory system that comprises multiple channels, wherein each channel connects two or more dies, the scheduling scheme in FIG. 7 (or an extended scheme for more than two dies per channel) can be used in parallel over the multiple channels.

The embodiments described above are given by way of example, and other suitable embodiments can also be used.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

Various aspects regarding efficient scheduling in FIG. 7 may be summarized as follows:

1. Fully utilizing the parallelism of each die by parallelizing the compression operations of different planes and/or parallelizing compression and data output operations of different planes. With optimal scheduling of plane operations, the parallelism can be fully utilized.

2. Utilizing multiple dies by reading from one die both confidence levels and hard data, while the other die performs data compression.

The invention claimed is:

1. An apparatus for data storage, comprising:
an interface, configured to communicate with a memory device that comprises (i) a plurality of memory cells and (ii) a data compression module; and
a processor, configured to:
determine a maximal number of errors that are required to be corrected by applying a soft decoding scheme to data retrieved from the memory cells; and
based on the maximal number of errors, determine an interval between multiple read thresholds for reading Code Words (CWs) stored in the memory cells for processing by the soft decoding scheme, so as to meet following conditions: (i) the soft decoding scheme achieves a specified decoding capability requirement, and (ii) a compression rate of the compression module when applied to confidence levels corresponding to readouts of the CWs, achieves a specified readout throughput requirement.

2. The apparatus according to claim 1, wherein the processor is configured to determine the interval, by estimating multiple attainable compression rates for different respective settings of the interval, and to select a setting of the interval that meets the conditions.

3. The apparatus according to claim 1, wherein the processor is configured to determine the interval for maximizing the readout throughput from the memory device.

4. The apparatus according to claim 1, wherein the processor is configured to determine the interval for minimizing a probability of decoding failure in decoding CWs using the soft decoding scheme.

5. The apparatus according to claim 1, wherein the processor is configured to decide to apply to subsequent CWs read from the memory cells a hard decoding scheme or the soft decoding scheme, based on an average number of errors detected in previously read CWs.

6. The apparatus according to claim 1, wherein the processor is configured to decide to apply the soft decoding scheme to subsequent CWs read from the memory cells, in response to detecting that a first readout throughput achievable using hard decoding is smaller than a second readout throughput achievable using soft decoding with confidence levels that were compressed by the compression module.

7. The apparatus according to claim 1, wherein the processor is configured to set a data rate of the interface depending on the compression rate being configured.

8. The apparatus according to claim 1, wherein the processor is configured to identify low parallelism random readout operations that are not constrained by a data rate of the interface, and to set the compression module so as not to compress confidence levels of the identified readout operations.

9. The apparatus according to claim 1, wherein the memory cells belong to multiple dies, and wherein the processor is configured to read compressed confidence levels from a first die among the multiple dies while one or more other dies among the multiple dies are occupied in compressing local confidence levels.

10. The apparatus according to claim 1, wherein the data compression module supports multiple compression configurations, and wherein the processor is configured to select a compression configuration among the supported compression configurations that meets the readout throughput requirement.

11. The apparatus according to claim 9, wherein the multiple compression configurations have multiple respective constant compression rates.

12. The apparatus according to claim 1, wherein the processor is configured to configure the data compression module to produce compressed confidence levels using a variable-rate compression configuration, and to receive the compressed confidence levels via the interface in multiple data segments having respective data lengths, in accordance with the variable-rate compression configuration.

13. The apparatus according to claim 1, wherein the compression module supports a lossy compression scheme, and wherein the processor is configured to estimate the maximal number of errors, depending on a number of errors contributed by the lossy compression scheme.

14. The apparatus according to claim 1, wherein the processor is configured to determine the interval so as to achieve a specified tradeoff between soft decoding capability and readout throughput.

15. A method for data storage, comprising:
in a memory controller that communicates with a memory device that comprises (i) a plurality of memory cells and (ii) a data compression module,
determining a maximal number of errors that are required to be corrected by applying a soft decoding scheme to data retrieved from the memory cells; and
based on the maximal number of errors, determining an interval between multiple read thresholds for reading Code Words (CWs) stored in the memory cells for processing by the soft decoding scheme, so as to meet following conditions: (i) the soft decoding scheme achieves a specified decoding capability requirement, and (ii) a compression rate of the compression module when applied to confidence levels corresponding to readouts of the CWs, achieves a specified readout throughput requirement.

16. The method according to claim 15, wherein determining the interval, comprises estimating multiple attainable compression rates for different respective settings of the interval, and selecting a setting of the interval that meets the conditions.

17. The method according to claim 15, wherein determining the interval comprises determining the interval for maximizing the readout throughput from the memory device.

18. The method according to claim 15, wherein determining the interval comprises determining the interval for minimizing a probability of decoding failure in decoding CWs using the soft decoding scheme.

19. The method according to claim 15, and comprising deciding to apply to subsequent CWs read from the memory cells a hard decoding scheme or the soft decoding scheme, based on an average number of errors detected in previously read CWs.

20. The method according to claim 15, and comprising deciding to apply the soft decoding scheme to subsequent CWs read from the memory cells, in response to detecting that a first readout throughput achievable using hard decoding is smaller than a second readout throughput achievable using soft decoding with confidence levels that were compressed by the compression module.

21. The method according to claim 15, and comprising setting a data rate of the interface depending on the compression rate being configured.

22. The method according to claim 15, and comprising identify low parallelism random readout operations that are not constrained by a data rate of the interface, and setting the compression module so as not to compress confidence levels of the identified readout operations.

23. The method according to claim 15, wherein the memory cells belong to multiple dies, and comprising reading compressed confidence levels from a first die among the multiple dies while one or more other dies among the multiple dies are occupied in compressing local confidence levels.

24. The method according to claim 15, wherein the data compression module supports multiple compression configurations, and comprising selecting a compression configuration among the supported compression configurations that meets the readout throughput requirement.

25. The method according to claim 24, wherein the multiple compression configurations have multiple respective constant compression rates.

26. The method according to claim 15, and comprising configuring the data compression module to produce compressed confidence levels using a variable-rate compression configuration, and receiving the compressed confidence levels in multiple data segments having respective data lengths, in accordance with the variable-rate compression configuration.

27. The method according to claim 15, wherein the compression module supports a lossy compression scheme, and comprising estimating the maximal number of errors, depending on a number of errors contributed by the lossy compression scheme.

28. The method according to claim 15, wherein determining the interval comprises determining the interval so as to achieve a specified tradeoff between soft decoding capability and readout throughput.

* * * * *